US008593314B2

(12) United States Patent
Haneda et al.

(10) Patent No.: US 8,593,314 B2
(45) Date of Patent: Nov. 26, 2013

(54) A/D CONVERSION CIRCUIT, INTEGRATED CIRCUIT DEVICE, ELECTRONIC APPARATUS

(75) Inventors: Hideo Haneda, Matsumoto (JP); Takemi Yonezawa, Fujimimachi (JP)

(73) Assignee: Seiko Epson Corporation, Tokyo (JP)

( * ) Notice: Subject to any disclaimer, the term of this patent is extended or adjusted under 35 U.S.C. 154(b) by 40 days.

(21) Appl. No.: 13/334,715

(22) Filed: Dec. 22, 2011

(65) Prior Publication Data

US 2012/0182166 A1    Jul. 19, 2012

(30) Foreign Application Priority Data

Jan. 17, 2011    (JP) ................. 2011-007104

(51) Int. Cl.
*H03M 1/06*       (2006.01)
(52) U.S. Cl.
USPC ........................... 341/118; 341/155; 341/144
(58) Field of Classification Search
USPC ................ 341/118, 120, 144, 155, 163
See application file for complete search history.

(56) References Cited

U.S. PATENT DOCUMENTS

| | | | | |
|---|---|---|---|---|
| 5,854,758 A * | 12/1998 | Kosuda et al. | | 708/404 |
| 5,870,052 A | 2/1999 | Dedic et al. | | |
| 6,748,201 B2 * | 6/2004 | Black et al. | | 455/240.1 |
| 7,409,199 B2 * | 8/2008 | Igarashi et al. | | 455/296 |
| 7,501,965 B2 * | 3/2009 | Janakiraman | | 341/118 |
| 7,583,210 B2 * | 9/2009 | Minobe | | 341/118 |
| 8,223,044 B2 * | 7/2012 | Snedeker | | 341/118 |
| 2010/0109924 A1 * | 5/2010 | Cho et al. | | 341/118 |
| 2010/0283645 A1 | 11/2010 | Haneda | | |
| 2012/0206283 A1 * | 8/2012 | Von Staudt | | 341/121 |

FOREIGN PATENT DOCUMENTS

| | | |
|---|---|---|
| JP | A-8-321779 | 12/1996 |
| JP | A-2010-263399 | 11/2010 |

* cited by examiner

*Primary Examiner* — Peguy Jean Pierre
(74) *Attorney, Agent, or Firm* — Oliff & Berridge, PLC

(57) ABSTRACT

An A/D conversion circuit in which a control circuit that has a successive approximation register storing data updated by a successive approximation operation generates correction data for correcting non-linearity between an input analog signal and an output digital signal, and a comparison unit corrects the non-linearity based on the correction data. An A/D conversion circuit includes a comparison unit which performs comparison operation in successive approximation and a control circuit having a successive approximation register storing successive approximation data updated by the successive approximation. The control circuit outputs correction data for correcting non-linearity between an input signal and output data of the A/D conversion circuit to the comparison unit based on one or plural bits of the successive approximation data. The comparison unit corrects the non-linearity of the A/D conversion circuit based on the correction data.

11 Claims, 19 Drawing Sheets

| S[3:0] | SD4P | SD3P | SD2P | SD1P |
|---|---|---|---|---|
| ... | ... | ... | ... | ... |
| -3 | VCM | VCM | GND | GND |
| -2 | VCM | VCM | GND | VCM |
| -1 | VCM | VCM | VCM | GND |
| 0 | VCM | VCM | VCM | VCM |
| 1 | VCM | VCM | VCM | VREF |
| 2 | VCM | VCM | VREF | VCM |
| 3 | VCM | VCM | VREF | VREF |
| ... | ... | ... | ... | ... |

| S[3:0] | SD4N | SD3N | SD2N | SD1N |
|---|---|---|---|---|
| ... | ... | ... | ... | ... |
| -3 | VCM | VCM | VREF | VREF |
| -2 | VCM | VCM | VREF | VCM |
| -1 | VCM | VCM | VCM | VREF |
| 0 | VCM | VCM | VCM | VCM |
| 1 | VCM | VCM | VCM | GND |
| 2 | VCM | VCM | GND | VCM |
| 3 | VCM | VCM | GND | GND |
| ... | ... | ... | ... | ... |

FIG. 10

| DTRM [3:0] | COMPLEMENT OF 2 | MULTIPLIER X FOR D[3:1] |
|---|---|---|
| 1 0 0 0 | -8 | (Don't care) |
| 1 0 0 1 | -7 | 0.875 |
| 1 0 1 0 | -6 | 0.750 |
| 1 0 1 1 | -5 | 0.625 |
| 1 1 0 0 | -4 | 0.500 |
| 1 1 0 1 | -3 | 0.375 |
| 1 1 1 0 | -2 | 0.250 |
| 1 1 1 1 | -1 | 0.125 |
| 0 0 0 0 | 0 | 0.000 |
| 0 0 0 1 | 1 | -0.125 |
| 0 0 1 0 | 2 | -0.250 |
| 0 0 1 1 | 3 | -0.375 |
| 0 1 0 0 | 4 | -0.500 |
| 0 1 0 1 | 5 | -0.625 |
| 0 1 1 0 | 6 | -0.750 |
| 0 1 1 1 | 7 | -0.875 |

| SEQUENCE | Main DAC | | | | | | | | Sub-DAC | | | |
|---|---|---|---|---|---|---|---|---|---|---|---|---|
| | D7 | D6 | D5 | D4 | D3 | D2 | D1 | D0 | S3 | S2 | S1 | S0 |
| 1 | 1 | 0 | 0 | 0 | 0 | 0 | 0 | 0 | 0 | 0 | 0 | 0 |
| 2 | 1 | 1 | 0 | 0 | 0 | 0 | 0 | 0 | 0 | 0 | 0 | 0 |
| 3 | 1 | 0 | 1 | 0 | 0 | 0 | 0 | 0 | 0 | 0 | 0 | 0 |
| 4 | 1 | 0 | 1 | 1 | 0 | 0 | 0 | 0 | 0 | 0 | 0 | 0 |
| 5 | 1 | 0 | 1 | 0 | 1 | 0 | 0 | 0 | 0 | 0 | 0 | 0 |
| 6 | 1 | 0 | 1 | 0 | 0 | 1 | 1 | 0 | 0 | 0 | 0 | 0 |
| 7 | 1 | 0 | 1 | 0 | 0 | 1 | 0 | 1 | 0 | 0 | 1 | 1 |
| 8 | 1 | 0 | 1 | 0 | 0 | 1 | 0 | 0 | 0 | 0 | 1 | 0 |

FIG. 15

A/D CONVERSION CIRCUIT, INTEGRATED CIRCUIT DEVICE, ELECTRONIC APPARATUS

TECHNICAL FIELD

The present invention relates to an A/D conversion circuit, an integrated circuit device, and an electronic apparatus or the like.

BACKGROUND ART

As an A/D conversion circuit which converts an analog signal to digital data, a successive approximation-type A/D conversion circuit is known previously. This successive approximation-type A/D conversion circuit has a comparison circuit, a successive approximation register, and a D/A conversion circuit, and performs A/D conversion by successive approximation, of a signal resulting from sampling and holding an input signal, and thus outputs digital data. As a related art of such a successive approximation-type A/D conversion circuit, a technique disclosed in Patent Document 1 or the like is known.

RELATED ART DOCUMENT

Patent Document

[Patent Document 1] JP-A-8-321779

SUMMARY OF THE INVENTION

Problems that the Invention is to Solve

The conversion accuracy of such an A/D conversion circuit depends mostly on the accuracy of the D/A conversion circuit. Thus, if the accuracy of the D/A conversion circuit is to be increased, the circuit becomes greater in scale due to the area of the capacitor in the case of charge redistribution type, and due to the area of the resistor in the case of ladder resistor type. Meanwhile, if the circuit of the D/A conversion circuit is contrived to restrain an increase in the scale of the circuit, this time, problems such as occurrence of a so-called missing code are generated because of an error of DNL, which stands for differential non-linearity, or INL, which stands for integral non-linearity.

According to some aspect of the invention, an A/D conversion circuit, an integrated circuit device and an electronic apparatus or the like which enable improvement in A/D conversion characteristics can be provided.

Means for Solving the Problems

An aspect of the invention relates to an A/D conversion circuit including a comparison unit which performs a comparison operation in successive approximation, and a control circuit which has a successive approximation register storing successive approximation data updated by the successive approximation, wherein the control circuit outputs correction data for correcting non-linearity between an input signal and output data of the A/D conversion circuit to the comparison unit, based on one or plural bits of the successive approximation data, and the comparison unit corrects the non-linearity based on the correction data.

According to an aspect of the invention, correction data is outputted based on one or plural bits of successive approximation data, and non-linearity of the A/D conversion circuit is corrected based on the correction data. Thus, A/D conversion characteristics can be improved. For example, when a non-linearity error corresponding to a specific bit of the successive approximation data is generated, the non-linear positive error can be corrected by making a correction based on one or plural bits of the successive approximation data.

Also, according to an aspect of the invention, the comparison unit may include a main D/A conversion circuit which performs D/A conversion of the successive approximation data and outputs a main D/A output signal corresponding to the successive approximation data, and a sub D/A conversion circuit which corrects non-linearity between the successive approximation data and the main D/A output signal, based on the correction data from the control circuit.

By doing so, the non-linearity of the main D/A conversion circuit can be corrected based on the correction data. Thus, characteristics of the A/D conversion circuit can be improved.

Moreover, according to an aspect of the invention, the comparison unit may include a comparison circuit with an input terminal thereof connected to a first node. The main D/A conversion circuit may include a first capacitor provided between the first node and a second node, a first D/A conversion circuit which is connected to the first node and performs D/A conversion based on high-order bits of the successive approximation data, and a second D/A conversion circuit which is connected to the second node and performs D/A conversion based on low-order bits of the successive approximation data. The sub D/A conversion circuit may include a second capacitor provided between the first node and a third node, and a trimming D/A conversion circuit which is connected to the third node and performs D/A conversion of the correction data based on one or plural bits of the low-order bits.

By doing so, D/A conversion based on low-order bits of the successive approximation data can be performed by the second D/A conversion circuit, and D/A conversion of the correction data based on one or plural bits of the low-order bits can be performed by the trimming D/A conversion circuit. Thus, a non-linearity error generated by an up or down digit shift between the high-order bits and the low-order bits of the successive approximation data can be corrected.

Also, according to an aspect of the invention, the sub D/A conversion circuit may include a code shift D/A conversion circuit connected to the third node. The code shift D/A conversion circuit may perform D/A conversion of temporally changing code data and outputs a code signal corresponding to the code data. The comparison circuit may perform processing to compare an addition signal of the main D/A output signal, the correction signal and the code signal, with a sampled signal of the input signal. The control circuit may output data found based on successive approximation result data and the code data, as output data.

By doing so, the successive approximation data can be made to change temporally by the temporally changing code data. Thus, a trimming setting value can be set based on an integrated value of output codes, as will be described later. Also, by temporally changing the code data, A/D conversion characteristics such as INL and DNL can be improved.

Moreover, according to an aspect of the invention, the control circuit may output the correction data based on a multiplication value of the trimming setting value by one or plural bits of the successive approximation data.

By doing so, the correction data based on one or plural bits of the successive approximation data can be outputted. Also, by adjusting the trimming setting value, the correction data according to a non-linearity error of the D/A conversion circuit can be outputted.

Also, according to an aspect of the invention, the control circuit may have a trimming setting value register which stores a trimming value that minimizes the non-linearity, as the trimming setting value, and output the correction data based on the stored trimming setting value.

By doing so, the non-linearity of the A/D conversion circuit can be minimized by a correction based on the correction data.

Moreover, according to an aspect of the invention, a setting circuit which sets the trimming setting value based on the output data may be included. The control circuit may sequentially output first to n-th correction data based on first to n-th trimming values which are different values (n being a natural number), to the comparison unit. The setting circuit may set a trimming value that minimizes the non-linearity, from among the first to n-th trimming values, as the trimming setting value.

By doing so, a trimming value that minimizes the non-linearity of the A/D conversion circuit, from among the first to n-th trimming values, can be set as the trimming setting value.

Also, according to an aspect of the invention, the setting circuit may multiply, plural times, an absolute value of the output data corresponding to an i-th trimming value (i being a natural number equal to or smaller than n) from among the first to n-th trimming values and thus find an i-th integrated value, and may set a trimming value corresponding to a minimum integrated value from among first to n-th integrated values, as the trimming setting value.

In this manner, by setting a trimming value corresponding to a minimum integrated value from among the first to n-th integrated values as the trimming setting value, linearity of the A/D conversion circuit can be improved.

Moreover, according to an aspect of the invention, the setting circuit may find a difference value between (j+1)th output data corresponding to the i-th trimming value from among the first to n-th trimming values and j-th output data, as a j-th difference value, then integrate absolute values of first to k-th difference values (k being a natural number; j being a natural number equal to or smaller than k) to find an i-th integrated value, and set a trimming value corresponding to a minimum integrated value from among the first to n-th integrated values, as the trimming setting value.

In this manner, by finding the difference value between the (j+1)th output data and the j-th output data, an offset of the output data can be canceled. Thus, the offset of the output data can be eliminated from the integrated value.

Also, another aspect of the invention relates to an integrated circuit device including the A/D conversion circuit according to one of the above aspects.

Moreover, another aspect of the invention relates to an electronic apparatus including the A/D conversion circuit according to one of the above aspects.

BRIEF DESCRIPTION OF THE DRAWINGS

FIG. 10 It is an explanatory view about switch control in a sub D/A conversion circuit.

FIG. 11 It shows an example of a range of change of trimming value.

FIG. 15 It shows an example of successive approximation processing carried out after a trimming setting value is decided.

MODE FOR CARRYING OUT THE INVENTION

Hereinafter, a preferred embodiment of the invention will be described in detail. It should be noted that this embodiment, described hereinafter, is not intended to unjustly limit the content of the invention described in the claims, and that all parts of the configuration described in this embodiment are not necessarily essential as means for resolution of the invention.

1. Configuration

Figure 1:
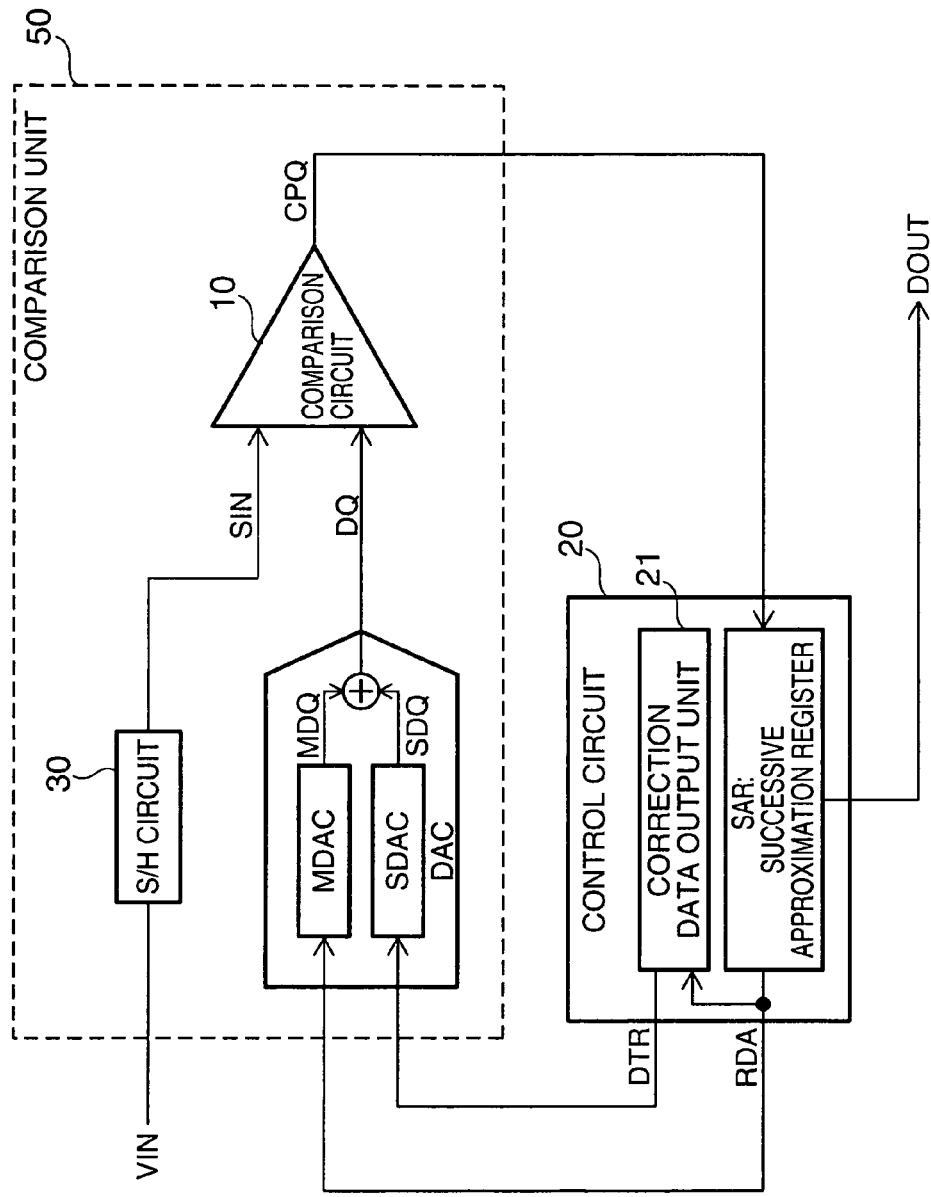
FIG. 1 It shows an example of the configuration of an A/D conversion circuit according to this embodiment.

FIG. 1 shows an example of the configuration of an A/D conversion circuit according to this embodiment. This A/D conversion circuit includes a comparison unit 50 and a control circuit 20. The comparison unit 50 includes a D/A conversion circuit DAC and a comparison circuit 10. Also, the comparison unit 50 can include an S/H (sample-and-hold) circuit 30.

However, the A/D conversion circuit of this embodiment is not limited to the configuration of FIG. 1 and various modified embodiments are possible such as omitting some of the components or adding other components. For example, components of the S/H circuit 30 may be omitted and the D/A conversion circuit may be provided with a sample-and-hold function for an input signal VIN.

The comparison circuit 10 is realized by a comparator and performs comparison, for example, between a signal SIN and a signal DQ. For example, the comparator is a latched comparator.

The control circuit 20 has a successive approximation register SAR (Successive Approximation Resistor) and outputs successive approximation data RDA (D/A input data). The successive approximation register SAR is a register with the register value thereof set by a comparison result signal CPQ from the comparison circuit 10. For example, when the comparison circuit 10 performs successive approximation from an MSB bit to an LSB bit, a comparison result ("1", "0") for each bit is stored as each register value of the successive approximation register SAR.

Also, the control circuit 20 has a correction data output unit 21. The correction data output unit 21 outputs correction data DTR based on correction target bit(s) which are one or plural bits of the successive approximation data RDA. The correction data DTR is data for correcting the non-linearity of the A/D conversion circuit and is data proportionate to a predetermined value (trimming setting value). For example, the correction data output unit 21 generates the correction data DTR based on a multiplication value of the trimming setting value and the correction target bit. Alternatively, the correction data output unit 21 may output the correction data DTR with reference to a lookup table where the correction target bit and the correction data DTR are associated with each other. Also, the trimming setting value may be set from outside of the IC or may be calculated and set within the IC, as will be described later.

Also, the control circuit 20 can perform control processing of each circuit block in the A/D conversion circuit. For example, on-off control of switch elements (switch array) included in D/A conversion circuits MDAC, SDAC is performed.

The D/A conversion circuit DAC performs D/A conversion of the successive approximation data RDA and the correction data DTR from the control circuit 20, and outputs a D/A output signal DQ corresponding to RDA and DTR (an analog signal formed by D/A-converting RDA and DTR). This D/A conversion circuit DAC may be a charge redistribution type using a capacitor array, or part or the whole thereof may be a ladder resistor type. Specifically, the D/A conversion circuit DAC includes a main D/A conversion circuit MDAC and a sub D/A conversion circuit SDAC.

The main D/A conversion circuit MDAC performs D/A conversion of the successive approximation data RDA and outputs a main D/A output signal MDQ corresponding to RDA (a first D/A output signal). The sub D/A conversion circuit SDAC performs D/A conversion of the correction data DTR and outputs a correction signal SDQ corresponding to DTR (a second D/A output signal). Then, the D/A conversion circuit DAC outputs the D/A output signal DQ based on MDQ and SDQ. For example, the D/A output signal DQ is an addition signal of MDQ and SDQ. As the main D/A output signal MDQ is corrected by the correction signal SDQ, the non-linearity of the main D/A conversion circuit MDAC is corrected.

The S/H (sample-and-hold) circuit 30 is a circuit which samples and holds the input signal VIN as a subject of A/D conversion. In the case of the charge redistribution type, the functions of the S/H circuit 30 can be realized by the D/A conversion circuit.

The comparison circuit 10 performs processing to compare the sampled signal SIN of the input signal VIN (a signal formed by sampling and holding VIN) with the D/A output signal DQ. Specifically, the comparison circuit 10 compares the sampled signal SIN inputted to a first input terminal with the D/A output signal DQ (D/A conversion voltage) inputted to a second input terminal. Also, in the case of the charge redistribution type or the like, the comparison circuit 10 may perform processing to compare a difference signal between the sampled signal SIN and the D/A output signal DQ with a reference signal (for example, ground voltage). Moreover, in the case of a differential type, the comparison circuit 10 may perform processing to compare a positive signal and a negative signal of the difference signal between SIN and DQ.

Then, the control circuit 20 outputs successive approximation result data (final data) from the successive approximation register SAR, as output data DOUT (output code). DOUT is A/D-converted data of the input signal VIN. However, in the case of code shift which will be described later, the control circuit 20 outputs data obtained by adding or subtracting the successive approximation result data and the code data, as the output data DOUT.

2. Digital Trimming Technique

Figure 2:
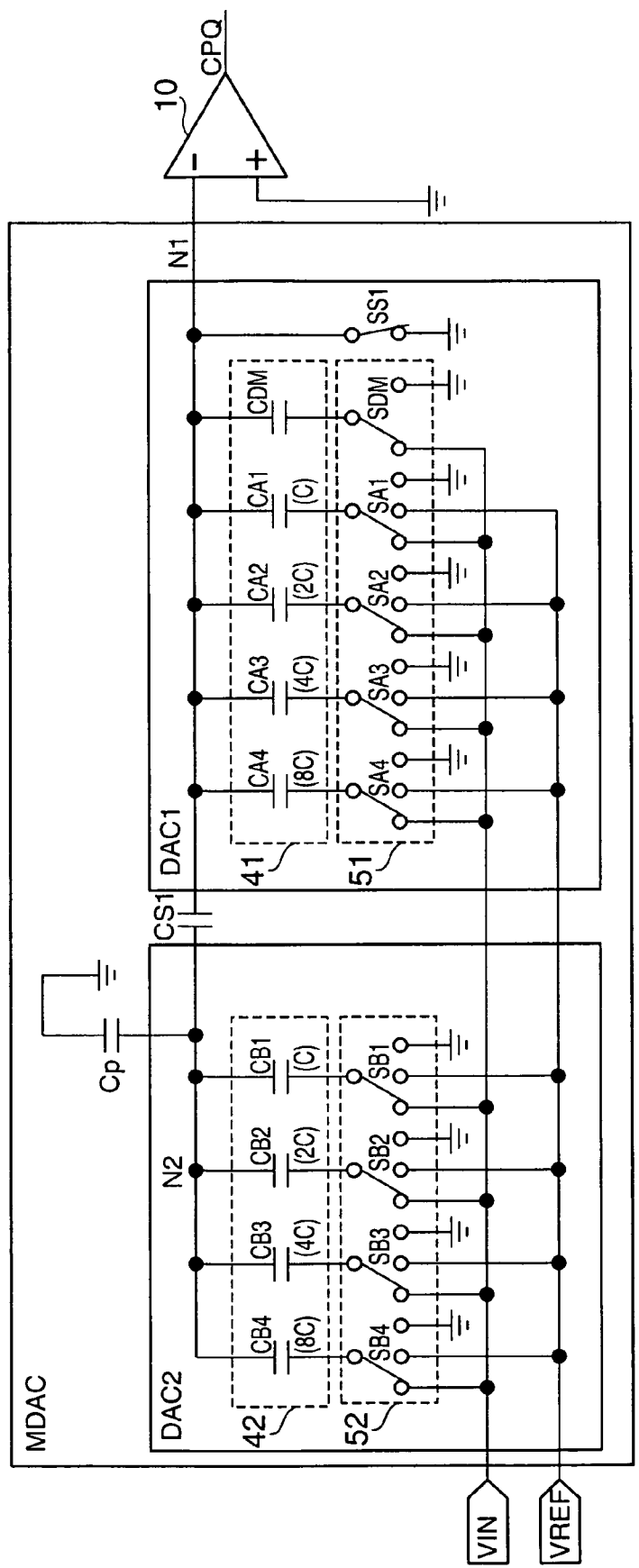
FIG. 2 It shows a comparative example of the A/D conversion circuit.

FIG. 2 shows a comparative example of the A/D conversion circuit according to this embodiment. This comparative example represents a comparative example of the DAC and the comparison circuit 10 shown in FIG. 1. In this comparative example, a serial capacitor CS1 is provided and capacitors weighted in a binary manner are configured in plural stages.

In this comparative example, only the above main D/A conversion circuit is included and the sub D/A conversion circuit is not included. In the successive approximation-type A/D conversion circuit, the linearity of the D/A conversion circuit largely influences the linearity of the A/D conversion circuit. In this comparative example, there is a problem that a parasitic capacitance Cp at a node N2 impairs DNL (Differential Non Linearity) and INL (Integral Non Linearity) of DAC. This is because the capacitance ratio weighted every binary is distorted by the parasitic capacitance Cp. This point will be described, taking the case where 8-bit successive approximation data D7 to D0 (D[7:0]) is D/A-converted by way of example.

FIG. 2 shows the connection state of switch elements SA1 to SA4 and SB1 to SB4 during a sampling period of the input signal VIN. In a successive approximation period, a switch element SS1 is off. The switch elements SA4 to SA1 and SB4 to SB1 are connected to a power-supply voltage VREF or ground voltage GND according to the successive approximation data D7 to D4, D3 to D0, respectively. The capacitance value of the serial capacitor CS1 is the same capacitance value C, for example, as CA1 and CB1.

In this case, an output voltage VDAC of the D/A conversion circuit is expressed by the following formula (1). Here, VDAC/LSB is a value standardized with the voltage of 1 LSB. Also, the range of the input signal VIN (input voltage) is standardized to −1 to 1. In the following formula (1), an offset and a gain error due to the parasitic capacitance are ignored.

[Formula 1]

$$VDAC/LSB = \\ 2^0 D0 + 2^1 D1 + 2^2 D2 + 2^3 D3 + 2^4 D4 + 2^5 D5 + 2^6 D6 + 2^7 D7 - \\ 127.5(VIN + 1) + 0.059(Cp/C)(2^4 D4 + 2^5 D5 + 2^6 D6 + 2^7 D7) \quad (1)$$

As shown in the above formula (1), a term proportionate to the parasitic capacitance Cp appears in VDAC. Since this term is proportionate only to four high-order bits D4 to D7 of the successive approximation data, linearity is significantly impaired near a code where the fifth bit from LSB changes. Specifically, as indicated by A1 in FIG. 3, a gap is generated in VDAC at a transition point between 00001111 (15 in the decimal system) and 00010000 (16). If this gap exceeds 1 LSB, the problem of a missing code occurs in A/D conversion.

In this respect, according to this embodiment, the correction signal SDQ is added to the D/A output signal DQ by the sub D/A conversion circuit SDAC as shown in FIG. 1. Specifically, as shown in the following formula (2), a voltage proportionate to correction target bits D1 to D3 of the successive approximation data is added to VDAC.

[Formula 2]

$$VDAC/LSB = 2^0 D0 + 2^1 D1 + 2^2 D2 + 2^3 D3 + 2^4 D4 + 2^5 D5 + \\ 2^6 D6 + 2^7 D7 - 127.5(VIN+1) + \alpha(D1 + 2^1 D2 + 2^2 D3) + \\ 0.059(Cp/C)(2^4 D4 + 2^5 D5 + 2^6 D6 + 2^7 D7) \quad (2)$$

α is a value proportionate to the trimming setting value, as will be described later. In this embodiment, a shown in the following formula (3) is set by properly setting a trimming value. In this case, the following formula (4) holds based on the above formula (2).

[Formula 3]

$$\alpha = 0.059(Cp/C) \times 2^1 \quad (3)$$

[Formula 4]

$$VDAC/LSB = 2^0 D0 + 2^1 D1 + 2^2 D2 + 2^3 D3 + 2^4 D4 + \\ 2^5 D5 + 2^6 D6 + 2^7 D7 - 127.5(VIN+1) + 0.059(Cp/C) \\ (2^1 D1 + 22D2 + 2^3 D3 + 2^4 D4 + 2^5 D5 + 2^6 D6 + 2^7 D7) \quad (4)$$

Figure 3:
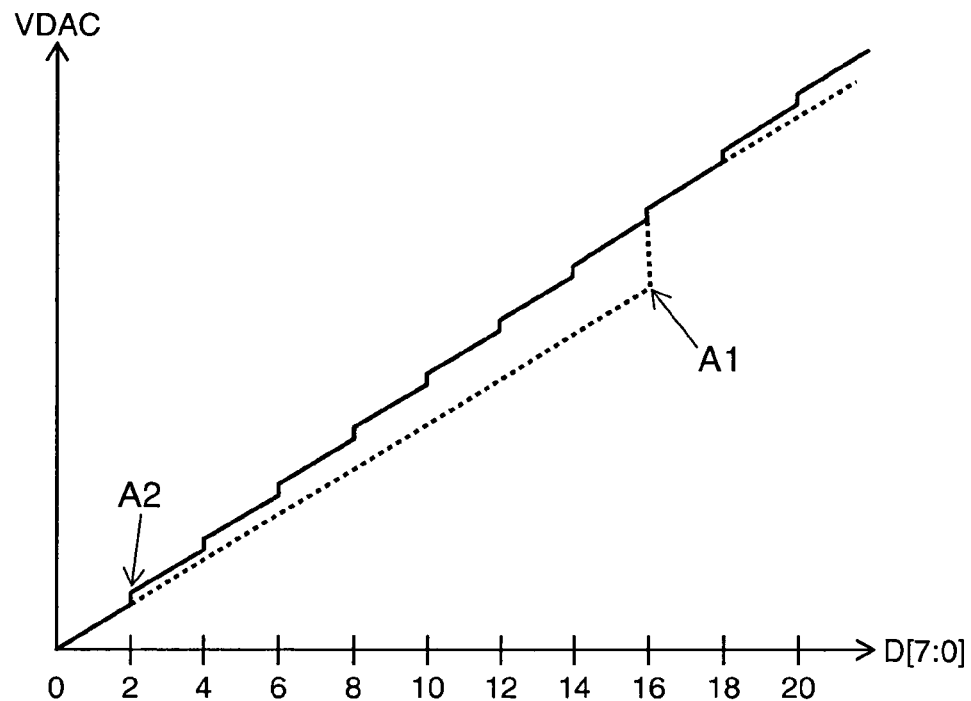
FIG. 3 It is an explanatory view about non-linearity error.
Figure 4A:
FIG. 4(A) and FIG. 4(B) are explanatory views about non-linearity error.
Figure 4B:
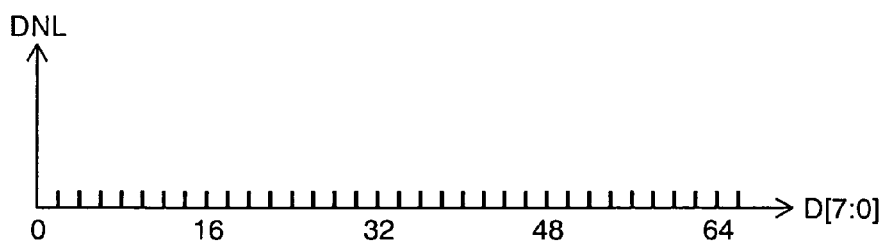

If the above formulae (2) and (4) are compared, the bit indicating non-linearity is changed from the fifth bit D4 from LSB to the second bit D1. That is, as indicated by A2 in FIG. 3, a gap is generated in VDAC at a transition point between 00000001 (1 in the decimal system) and 00000010 (2). The potential difference of this gap is $2^1/2^4 = 1/8$ compared with the comparative example. This is equivalent to subdividing DNL as shown in FIG. 4(B), compared with DNL of the comparative example shown in FIG. 4(A). In this manner, the linearity of the D/A conversion circuit can be improved and therefore DNL and INL of the A/D conversion circuit can be improved.

3. D/A Conversion Circuit

Figure 5:
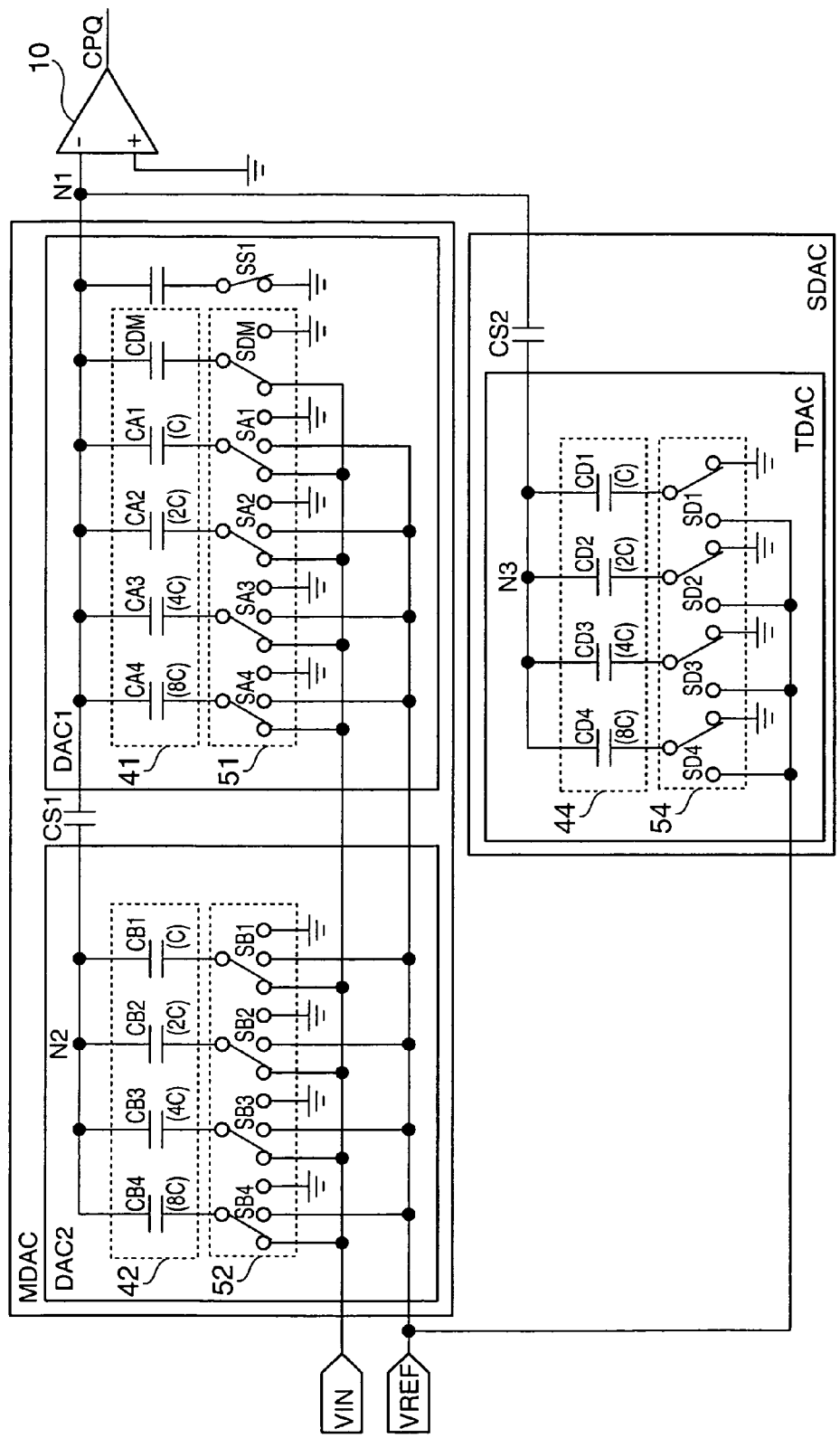
FIG. 5 It shows a detailed example of the configuration of the A/D conversion circuit according to this embodiment.

FIG. 5 shows a detailed example of the configuration of the A/D conversion circuit according to this embodiment. FIG. 5 shows a detailed example of the configuration of MDAC, SDAC and the comparison circuit 10. MDAC and SDAC are formed by charge redistribution-type D/A conversion circuits.

Specifically, the main D/A conversion circuit MDAC includes a first D/A conversion circuit DAC1 (first main D/A conversion circuit) connected to a first node N1, a second D/A conversion circuit DAC2 (second main D/A conversion circuit) connected to a second node N2, and a first serial capacitor CS1 provided between the node N1 and the node N2.

DAC1 includes a first capacitor array section 41 and a first switch array section 51. DAC1 also includes a switch element SS1 for setting the node N1 to a ground voltage GND (in a broad sense, a first reference voltage) during a sampling period. DAC2 includes a second capacitor array section 42 and a second switch array section 52.

Also, one end of a third serial capacitor may be connected to the node N2, and a capacitor array section and a switch array section having similar configurations as the capacitor array section 42 and the switch array section 52 may be provided on the other end side of this third serial capacitor.

The capacitor array section 41 of DAC1 includes plural capacitors CA1 to CA4. These capacitors CA1 to CA4 have one ends thereof connected to the first node N1 of the comparison circuit 10. Here, the first node N1 (sampling node) is a node connected to a first input terminal (inverting input terminal) of the comparison circuit 10. A second input terminal (non-inverting input terminal) of the comparison circuit 10 is set to GND. Also, the capacitors CA1 to CA4 are weighted in a binary manner. For example, the capacitance values of CA1, CA2, CA3 and CA4 are C, 2C, 4C and 8C in the case of 4 bits. The first capacitor array section 41 may also include dummy capacitor CDM.

The switch array section 51 of DAC1 includes plural switch elements SA1 to SA4. These switch elements SA1 to SA4 are connected to the other ends of the capacitors CA1 to CA4 of the first capacitor array section 41. Then, the switch elements SA1 to SA4 are switch-controlled based on data of high-order bits of the successive approximation data D0 to D7 (for example, if D0 to D7 are 8 bits, data of four high-order bits D4 to D7).

The capacitor array section 42 of DAC2 includes plural capacitors CB1 to CB4. These capacitors CB1 to CB4 have one ends thereof connected to the second node N2. Here, the second node N2 is a node on the other end side of the serial capacitor CS1 with the one end thereof connected to the first node N1. Also, the capacitors CB1 to CB4 are weighted in a binary manner. For example, the capacitance values of CB1, CB2, CB3 and CB4 are C, 2C, 4C and 8C in the case of 4 bits.

The switch array section 52 of DAC2 includes plural switch elements SB1 to SB4. These switch elements SB1 to SB4 are connected to the other ends of the capacitors CB1 to CB4 of the second capacitor array section 42. Then, the switch elements SB1 to SB4 are switch-controlled based on data of low-order bits of the successive approximation data D0 to D7 (for example, if D0 to D7 are 8 bits, data of four low-order bits D0 to D3).

The sub D/A conversion circuit SDAC includes a second serial capacitor CS2 provided between the first node N1 and the third node N3, and a trimming D/A conversion circuit TDAC connected to the third node N3. TDAC includes a third capacitor array section 44 and a third switch array section 54.

The capacitor array section 44 of TDAC includes plural capacitors CD1 to CD4. These capacitors CD1 to CD4 have one ends thereof connected to the third node N3. Here, the third node N3 is a node on the other end side of the serial capacitor CS2 with the one end thereof connected to the first node N1. Also, the capacitors CD1 to CD4 are weighted in a binary manner. For example, the capacitance values of CD1, CD2, CD3 and CD4 are C, 2C, 4C and 8C in the case of 4 bits.

The switch array section 54 of TDAC includes plural switch elements SD1 to SD4. These switch elements SD1 to SD4 are connected to the other ends of the capacitors CD1 to CD4 of the third capacitor array section 44. Then, the switch elements SD1 to SD4 are switch-controlled based on the correction data DTR.

Specifically, the correction data output unit 21 of FIG. 1 outputs the correction data DTR to the D/A conversion circuit SDAC, and the switch elements SD1 to SD4 are switch-controlled based on this correction data DTR. More specifically, if the correction data DTR is 4-bit data S3 to S0 (S[3:0]) and the capacitors CD1 to CD4 correspond to S0 to S3, respectively, the output voltage of the sub D/A conversion circuit SDAC is expressed by the following formula (5). In the following formula (5), the capacitance values of CS1 and CS2 are the same (substantially the same).

[Formula 5]

$$2^0 S0 + 2^1 S1 + 2^2 S2 + 2^3 S3 \quad (5)$$

Based on the above formulae (2) and (5), the output voltage of SDAC satisfies the following formula (6). That is, the correction data output unit 21 outputs the correction data S0 to S3 that satisfy the following formula (6) to the sub D/A conversion circuit SDAC.

[Formula 6]

$$2^0 S0 + 2^1 S1 + 2^2 S2 + 2^3 S3 = \alpha(D1 + 2^1 D2 + 2^2 D3) \tag{6}$$

As digital trimming is carried out in this manner based on the correction data S0 to S3 corresponding to the correction target bits D1 to D3 (one or plural bits of the successive approximation data), occurrence of a missing code can be restrained. Also, it suffices that the correction target bits are one or plural bits of the low-order bits D0 to D3 of the successive approximation data that is D/A-converted by the second D/A conversion circuit DAC2, and include at least the highest bit D3 of the lower-order bits.

In the above, the resolutions of DAC2 and SDAC are the same (substantially the same) resolution of 1 LSB. However, the resolutions of DAC2 and SDAC may be different. For example, in a differential-type D/A conversion circuit, described below, the resolution of SDAC is (½) LSB.

Figure 6:
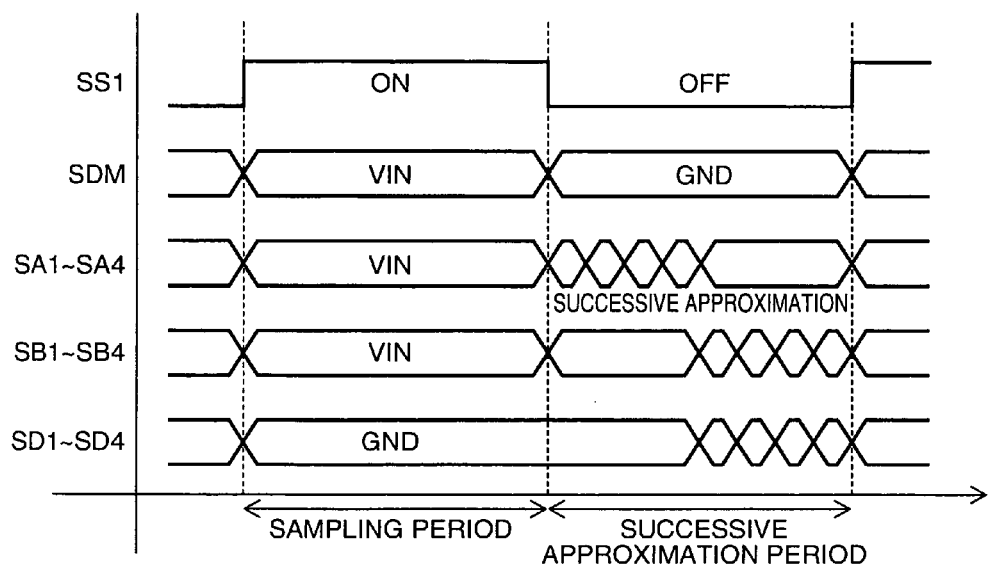
FIG. 6 It is an explanatory view of operation of the A/D conversion circuit.

Next, operations in this embodiment will be described in detail with reference to FIG. 6. As shown in FIG. 6, during a sampling period of the input signal VIN, the switch element SS1 of the main D/A conversion circuit MDAC is on and the node N1 is set to GND. Also, the other ends of the capacitors CA1 to CA4 and CB1 to CB4 are set to the voltage level of VIN via the switch elements SA1 to SA4 and SB1 to SB4 of MDAC.

Thus, the input signal VIN is sampled. Then, as the switch elements SA1 to SA4 and SB1 to SB4 turn off, the voltage of the input signal VIN is held with that timing. Meanwhile, during the sampling period, the other end of the dummy capacitor CDM is set to the voltage level of VIN via a switch element SDM for the dummy capacitor.

Also, during the sampling period, the other ends of the capacitors CD1 to CD4 are set to GND via the switch elements SD1 to SD4.

Next, as a successive approximation period of A/D conversion starts, the switch element SS1 of the main D/A conversion circuit MDAC turns off. Also, the other end of the switch element SDM for the dummy capacitor is set to GND.

Then, the switch elements SA1 to SA4 and SB1 to SB4 of MDAC are switch-controlled based on each bit of the successive approximation data D7 to D0 (D[7:0]), and the other ends of the capacitors CA1 to CA4 and CB1 to CB4 are set to the power-supply voltage VREF (in a broad sense, a second reference voltage) or the ground voltage GND (in a broad sense, a first reference voltage).

For example, if the successive approximation data is D[7:0]=10000000, the other end of the capacitor CA4 corresponding to MSB of D[7:0] is set to VREF. Also, the other ends of the other capacitors CA3 to CA1 and CB4 to CB1 are set to GND.

Meanwhile, if the successive approximation data is D[7:0]=10001000, the other ends of the capacitors CA4 and CB4 are set to VREF. Also, the other ends of the other capacitors CA3 to CA1 and CB3 to CB1 are set to GND.

Moreover, as the successive approximation period of A/D conversion starts, the switch elements SD1 to SD4 of SDAC are switch-controlled based on each bit of the correction data S3 to S0 (S[3:0]), and the other ends of the capacitors CD1 to CD4 are set to VREF or GND.

For example, if the correction data is S[3:0]=1000, the other end of the capacitor CD4 is set to VREF and the other ends of the other capacitors CD3 to CD1 are set to GND. Meanwhile, if the correction data is S[3:0]=1100, the other ends of the capacitors CD4 and CD3 are set to VREF and the other ends of the other capacitors CD2 and CD1 are set to GND.

In this case, the correction data S[3:0] changes according to the correction target bit D[3:1]. That is, the other ends of the capacitors CD1 to CD4 of SDAC are set to GND until successive approximation of the bit D[3:1] starts. Then, as the successive approximation of the bit D[3:1] starts, the correction data S[3:0] changes according to the change of the bit D[3:1] and the other ends of the CD1 to CD4 are set to VREF or GND.

In the charge redistribution-type A/D conversion circuit of FIG. 5, comparison between the sampled signal (sampled voltage) of VIN, and the addition signal (addition voltage) of the D/A output signal and the correction signal (correction voltage) is carried out. In the successive approximation register SAR of FIG. 1, data DOUT of the result of the comparison is stored.

Specifically, in the sampling period, electric charge corresponding to the input signal VIN is stored in the capacitors CA1 to CA4 and CB1 to CB4. Then, this electric charge stored according to VIN is compared with the electric charge stored in the capacitors CA1 to CA4, CB1 to CB4 and CD1 to CD4 according to the successive approximation data D7 to D0 and the correction data S3 to S0 in the successive approximation period. Then, the successive approximation data D7 to D0 provided when the two electric charges coincide with each other are outputted as output data DOUT from the successive approximation register SAR.

4. Control Circuit

Figure 7:
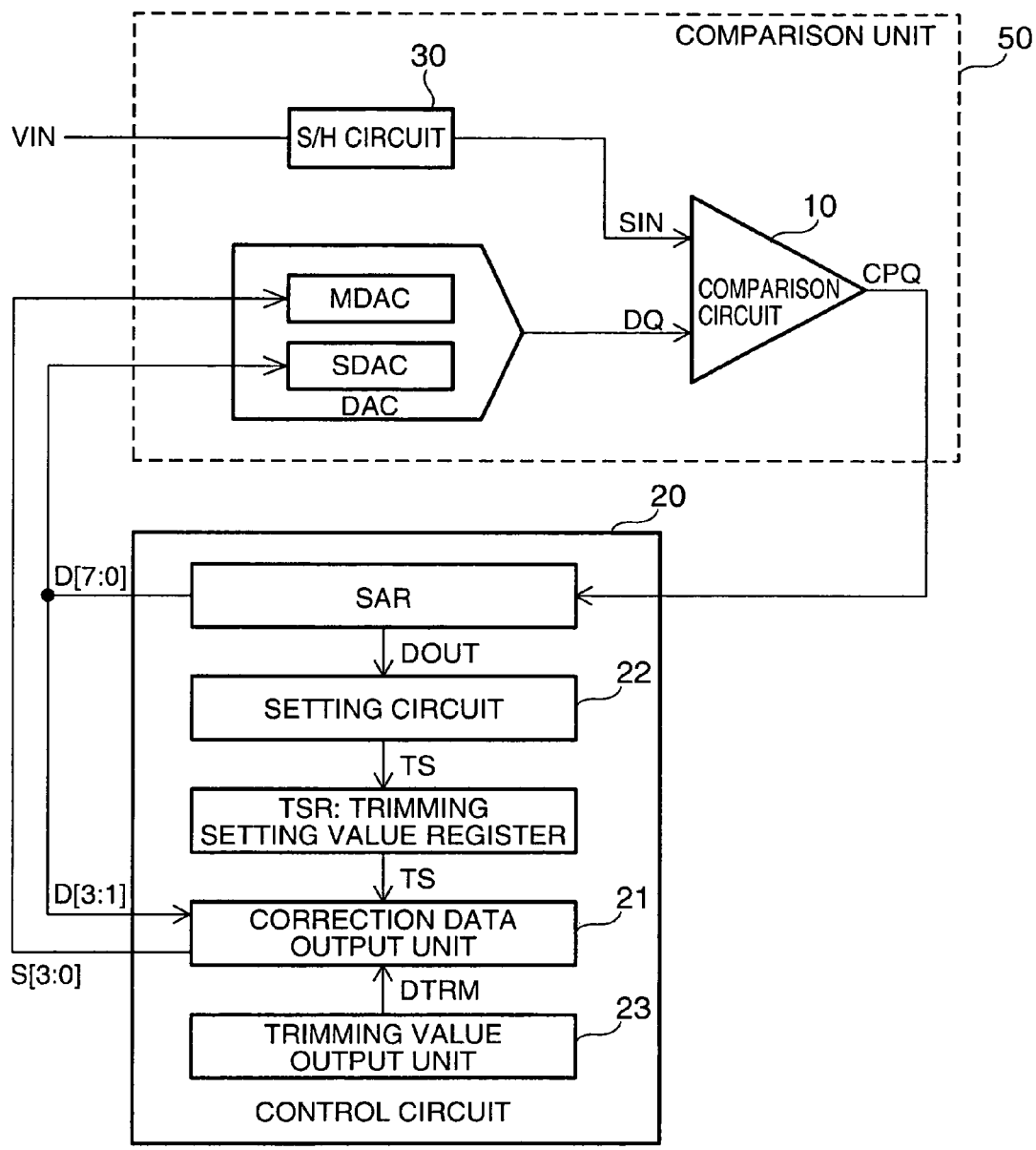
FIG. 7 It shows a second detailed example of the configuration of the A/D conversion circuit according to this embodiment.

FIG. 7 shows a second detailed example of the configuration of the A/D conversion circuit according to this embodiment. In this example of the configuration, the control circuit 20 includes a successive approximation register SAR, a setting circuit 22, a trimming setting value register TSR, a correction data output unit 21, and a trimming value output unit 23.

It should be noted that this embodiment is not limited to the configuration of FIG. 7 and that various modified embodiments are possible such as partly omitting the components thereof or adding other components. For example, the setting circuit 22 and the trimming value output unit 23 may be omitted and A/D conversion characteristics may be measured by an external tester or the like so as to set a trimming setting value.

In the example of the configuration of FIG. 7, a trimming value DTRM is changed, and an optimum trimming value is found based on the result of successive approximation with each trimming value and that trimming value is stored as a trimming setting value TS. For example, this operation is carried out in an initial operation (reset operation) of the A/D conversion circuit. Then, in a normal A/D conversion operation, the correction data S3 to S0 (S[3:0]) are outputted based on the stored trimming setting value TS.

Hereinafter, the case of 8-bit D/A conversion shown in FIG. 5 will be described in detail by way of example. The trimming value output unit 23 sequentially outputs, for example, the trimming values DTRM=7, 6, 5, ..., 0 (first to n-th trimming values, n being a natural number equal to or greater than 2). The correction data output unit 21 outputs the correction data S3 to S0, for example, shown in the following formula (7), based on the trimming values DTRM and the correction target bits D3 to D1 (D[3:1]).

[Formula 7]

$$2^0 S0 + 2^1 S1 + 2^2 S2 + 2^3 S3 = \alpha(D1 + 2^1 D2 + 2^2 D3),$$

$$\alpha = DTRM \times 2^{-2} \tag{7}$$

If the trimming setting value is found in the initial operation or the like, the input signal VIN is set to a predetermined voltage (for example, ½ VREF, GND, VREF or the like). However, if the trimming setting value is found at the time of product testing or the like, a sine wave or the like may be inputted as the input signal VIN. The comparison unit 50 performs A/D conversion plural times with each trimming value DTRMi (i-th trimming value, i being a natural number of in) and finds plural successive approximation result data.

The setting circuit 22 calculates an evaluation value for evaluating characteristics of the A/D conversion circuit in relation to each trimming value DTRMi, based on the plural output data DOUT (successive approximation result data) from successive approximation register SAR. For example, the evaluation value is an integral value of difference of DOUT that correlates with the number of effective bits of the A/D conversion circuit, as will be described later. The setting circuit determines a trimming value that leads to optimum characteristics of the A/D conversion circuit (minimum non-linearity error of the D/A conversion circuit), based on the evaluation value. Then, the setting circuit 22 sets this trimming value in the trimming setting value register TSR as the trimming setting value TS. TS is ideally a value that satisfies the following formula (8).

[Formula 8]

$$\alpha = TS \times 2^{-2} = 0.059(Cp/C) \times 2^1 \tag{8}$$

At the time of normal A/D conversion, the correction data output unit 21 outputs the correction data S3 to S0 for which DTRM=TR is held in the above formula (7). In this manner, the trimming setting value that minimizes the non-linearity error of the D/A conversion circuit can be set and the linearity of the A/D conversion circuit can be improved.

Meanwhile, the correction data S3 to S0 may be found by an arithmetic operation corresponding to the above formula (7) or may be found according to a lookup table corresponding to each trimming value. In the case of a lookup table, the trimming value may be, for example, a variable that designates a lookup table.

Figure 8:
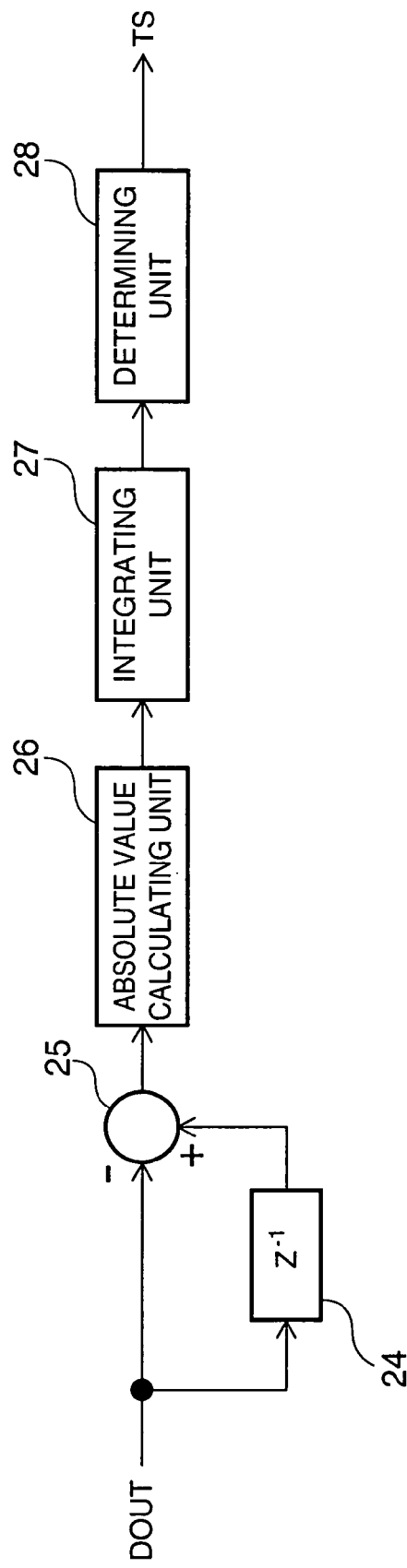
FIG. 8 It shows a detailed example of the configuration of a setting circuit.

FIG. 8 shows a detailed example of the configuration of the setting circuit 22. This setting circuit includes a storage unit 24, a subtracting unit 25, an absolute value calculating unit 26, an integrating unit 27, and a determining unit 28. It should be noted that the setting circuit of this embodiment is not limited to the configuration of FIG. 8 and various modified embodiments are possible such as partly omitting the components thereof or adding other components. For example, the storage unit 24 and the subtracting unit 25 may be omitted.

The successive approximation register SAR outputs first to k-th output data DOUT1 to DOUTk (k being a natural number) as plural output data corresponding to one trimming value DTRMi. The storage unit 24 stores j-th output data (j being a natural number of j≤k) which is previous output data. The subtracting unit 25 finds a difference value between (j+1)th output data DOUTj+1 which is current output data and the previous output data DOUTj, as a j-th difference value.

The absolute value calculating unit 26 calculates the absolute value of the j-th difference value as a j-th absolute value. The integrating unit 27 integrates (adds up) the first to k-th absolute values. The integrated value is outputted to the determining unit 28 as an i-th integral value of difference (i-th integrated value) corresponding to the i-th trimming-value DTRMi.

The determining unit 28 determines a minimum integral value of difference of the first to n-th integral values of difference and outputs a trimming value corresponding to the minimum integral value of difference as the trimming setting value TS. For example, the determining unit 28 compares the i-th integral value of difference with the (i−1)th integral value of difference, and sets the i-th trimming value in the trimming setting value register TSR if the i-th integral value of difference is smaller.

In this manner, the trimming setting value TS that leads to optimum characteristics of the A/D conversion circuit can be set. Specifically, the value of the output data DOUT of the A/D conversion circuit fluctuates due to noise, code shift which will be described later, a sine wave VIN or the like. Because of this fluctuation, the output data DOUT1 to DOUTk include codes before and after the gap of the D/A output voltage VDAC as described with reference to FIG. 3. Therefore, the integral value of difference of DOUT1 to DOUTk becomes smaller as the linearity of the D/A conversion circuit becomes higher. That is, characteristics of the A/D conversion circuit can be improved by setting a trimming setting value that leads to a minimum integral value of difference.

Also, an offset of the output data can be canceled by integrating the difference of the output data. In the case where the difference is not taken, if there is an offset, the offset becomes integrated. Then, problems occur that the memory which stores the integrated values overflows and that there is little difference between integral values corresponding to respective trimming values. In this respect, according to this embodiment, since the offset is canceled by the difference, the problem of the offset being integrated is solved.

5. Full-Differential Type

Figure 9:
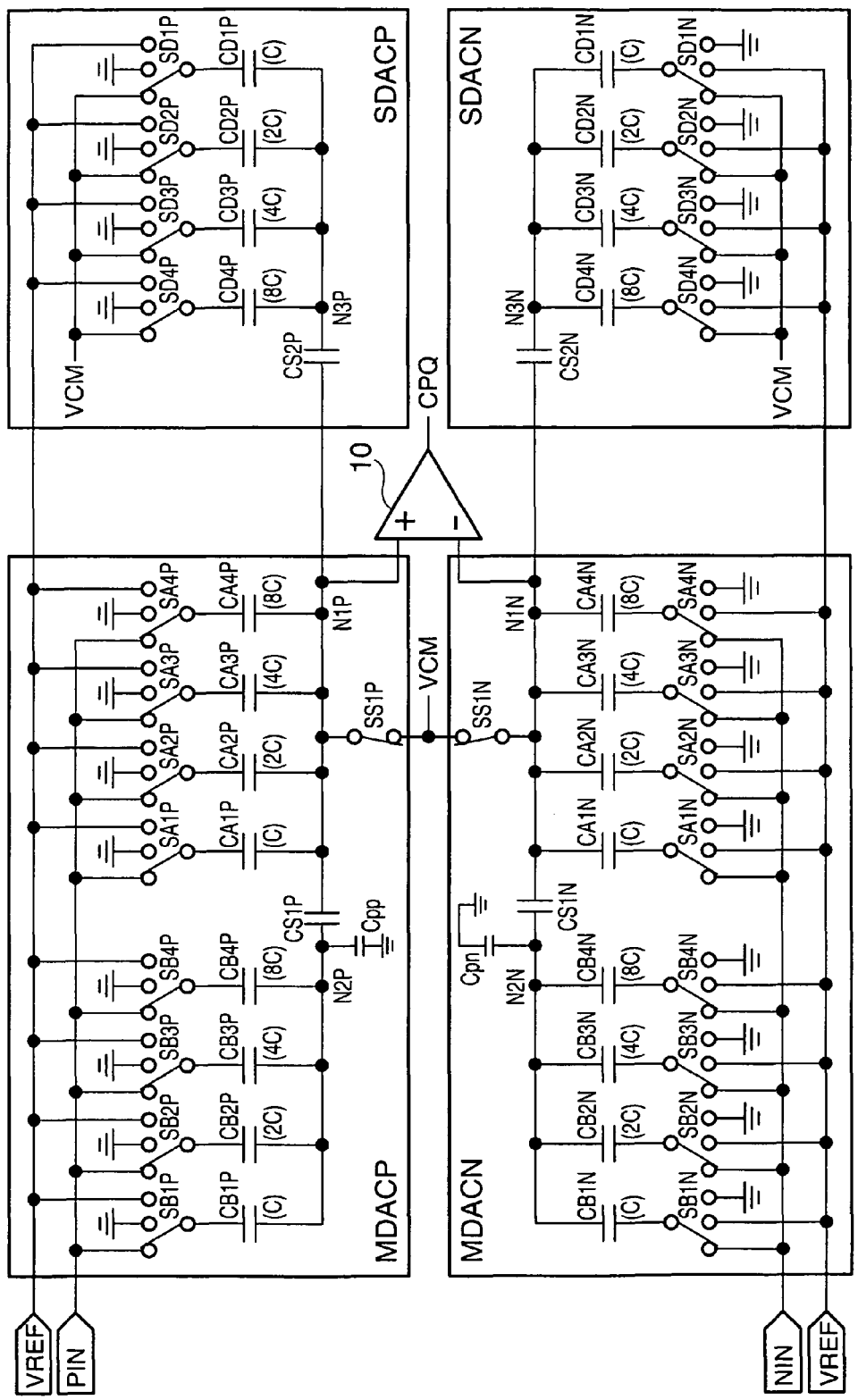
FIG. 9 It shows a third detailed example of the configuration of the A/D conversion circuit according to this embodiment.

FIG. 9 shows a third detailed example of the configuration of the A/D conversion circuit according to this embodiment. FIG. 9 shows an example of a full-differential type configuration of DAC and the comparison circuit 10 shown in FIG. 1. This D/A conversion circuit includes a main D/A conversion circuit MDACP connected to a non-inverting input terminal of the comparison circuit 10, and a main D/A conversion circuit MDACN connected to an inverting input terminal of the comparison circuit 10. Also, the D/A conversion circuit includes a sub D/A conversion circuit SDACP connected to the non-inverting input terminal and a sub D/A conversion circuit SDACN connected to the inverting input terminal.

The configurations of the main MDACP on the non-inverting side (positive side) and the main MDACN on the inverting side (negative side) include a capacitor array section and a switch array section, similarly to the main D/A conversion circuit MDAC of FIG. 5. Then, a non-inverting side (positive side) input signal PIN that forms a differential signal is inputted to MDACP, and an inverting side (negative side) input signal NIN that forms the differential signal is inputted to MDACN.

Then, during a sampling period, a node N1P of MDACP is set to a common voltage (intermediate voltage) VCM by a switch element SS1P. Also, a node N1N of MDACN is set to the common voltage VCM by a switch element SS1N.

Moreover, during the sampling period, one ends of switch elements SA1P to SA4P and SB1P to SB4P of MDACP are connected to the non-inverting side signal PIN of the differential signal, and one ends of switch elements SA1N to SA4N and SB1N to SB4N of MDACN are connected to the inverting side signal NIN of the differential signal.

Meanwhile, during a successive approximation period, the one ends of the switch elements SA1P to SA4P and SB1P to SB4P of MDACP are connected to VREF if a corresponding bit of successive approximation data is "1", and connected to GND if the corresponding bit is "0".

On the other hand, the one ends of the switch elements SA1N to SA4N and SB1N to SB4N of MDACN are connected to GND if a corresponding bit of successive approximation data is "1", and connected to VREF if the corresponding bit is "0".

The sub D/A conversion circuit SDACP on the non-inverting side and the sub D/A conversion circuit SDACN on the inverting side include a capacitor array section and a switch array section, similarly to the sub D/A conversion circuit DAC2 of FIG. 5.

Then, during the sampling period, one ends of switch elements SD1P to SD4P of SDACP and one ends of switch elements SD1N to SD4N of SDACN are connected to VCM.

Meanwhile, during the successive approximation period, the one ends of the switch elements SD1P to SD4P of SDACP are connected to VREF, GND, or VCM according to correction data S[3:0] as shown in FIG. 10. The one ends of the switch elements SD1N to SD4N of SDACN are connected to VREF, GND, or VCM according to the correction data S[3:0] as shown in FIG. 10.

It is assumed that a parasitic capacitance with a capacitance value Cpp is parasitic on a node N2P of MDACP and a parasitic capacitance with a capacitance value Cpn is parasitic on a node N2N of MDACN, as shown in FIG. 9. In this case, a D/A output voltage VDAC is expressed by the following formula (9). VIN=PIN−NIN holds and VIN is assumed to be standardized from −1 to +1.

[Formula 9]

$$VDAC/LSB = 2^0 D0 + 2^1 D1 + 2^2 D2 + 2^3 D3 + 2^4 D4 + 2^5 D5 + \\ 2^6 D6 + 2^7 D7 - 127.5(VIN+1) + \alpha(D1 + 2^1 D2 + 2^2 D3) + \\ 0.059\{(Cpp+Cpn)/C\}(2^4 D4 + 2^5 D5 + 2^6 D6 + 2^7 D7) \quad (9)$$

As shown in FIG. 10, in the sub D/A conversion circuit SDAC, D/A conversion is performed as the switch elements are connected to VREF or GND, based on the common voltage VCM as a reference. Meanwhile, in the main D/A conversion circuit MDAC, D/A conversion is performed as the switch elements are connected to VREF or GND. Therefore, the resolution of SDAC (lowest bit) is (½) LSB, compared with 1 LSB of MDAC. That is, the correction data S[3:0] corresponding to the trimming value DTRM is expressed by the following formula (10).

[Formula 10]

$$2^{-1}S0 + 2^0 S1 + 2^1 S2 = |\alpha|(D1 + 2^1 D2 + 2^2 D3),$$

$$\alpha = DTRM \times 2^{-3} \quad (10)$$

By setting a value that satisfies (substantially matches) the following formula (11) as a trimming setting value TS on the basis of the above formulae (9) and (10), the non-linearity error of the D/A conversion circuit can be corrected. A TS setting technique is similar to the above technique described with reference to FIG. 8 or the like.

[Formula 11]

$$\alpha = TS \times 2^{-3} = 0.059\{(Cpp+Cpn)/C\} \times 2^1 \quad (11)$$

FIG. 11 shows an example of a range of change of the trimming value DTRM. As shown in FIG. 11, DTRM is, for example, 4-bit binary data DTRM[3:0]. DTRM[3:0] is a complement of 2 and can take a range of −7 to +7. A multiplier X is a multiplier of correction data corresponding to the value of D[3:1] and $X = DTRM \times 2^{-3}$ holds.

Figure 12A:
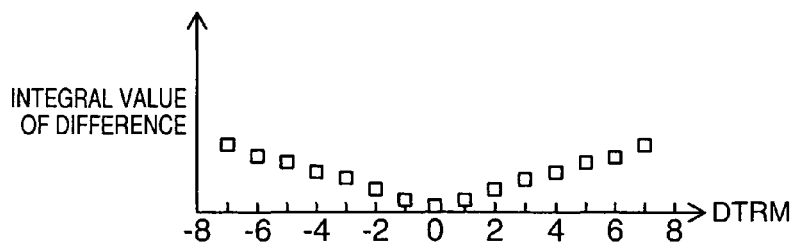
FIG. 12(A) to FIG. 12(C) show the results of simulations where the trimming value is changed.
Figure 12B:
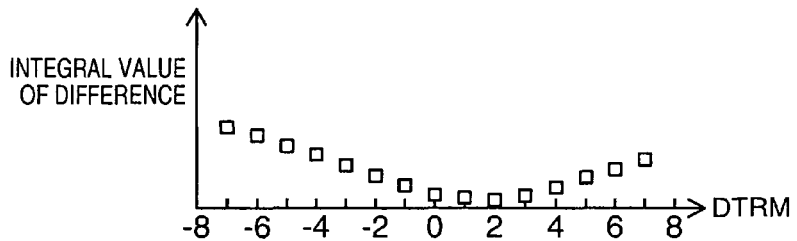
Figure 12C:
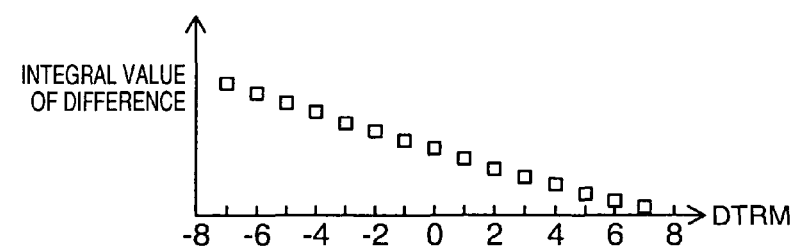
Figure 13:
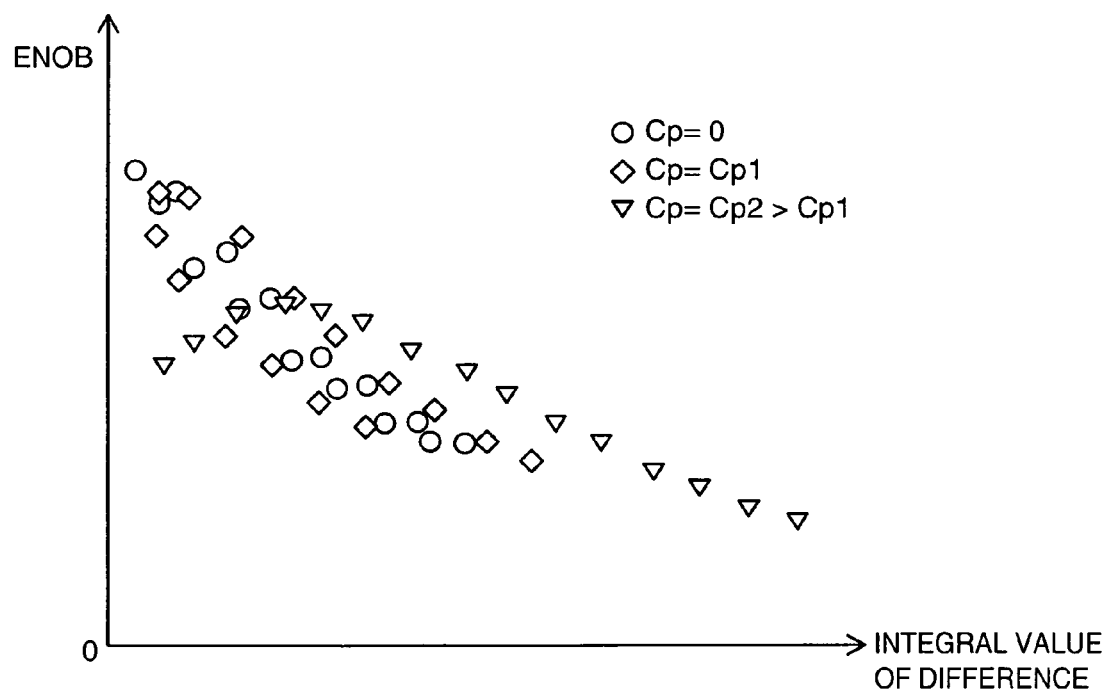
FIG. 13 It shows the results of a simulation where the trimming value is changed.

FIG. 12(A) to FIG. 13 show the results of simulations where DTRM is changed within the range of −7 to +7. As shown in FIG. 12(A), if CP=Cpp=Cpn=0 fF (fF: femtofarad) holds, the integral value of difference is minimum for DTRM=0. As shown in FIG. 12(B) and FIG. 12(C), as Cp increases to Cp1, Cp2 (>Cp1), DTRM that leads to the minimum integral value of difference shifts toward the positive side.

As shown in FIG. 12(A) to FIG. 12(C), the number of effective bits ENOB of the A/D conversion circuit correlates (substantially correlates) with the integral value of difference. That is, the smaller the integral value of difference is, the greater the number of ENOB bits is. As shown in FIG. 13, if the relation between the integral value of difference and ENOB is plotted, ENOB values are lined up along a straight line and it can be understood that there is a correlation between the integral value of difference and ENOB. Thus, by finding a trimming value that leads to a minimum integral value of difference, characteristics of the A/D conversion circuit such as ENOB can be improved.

Figure 14:
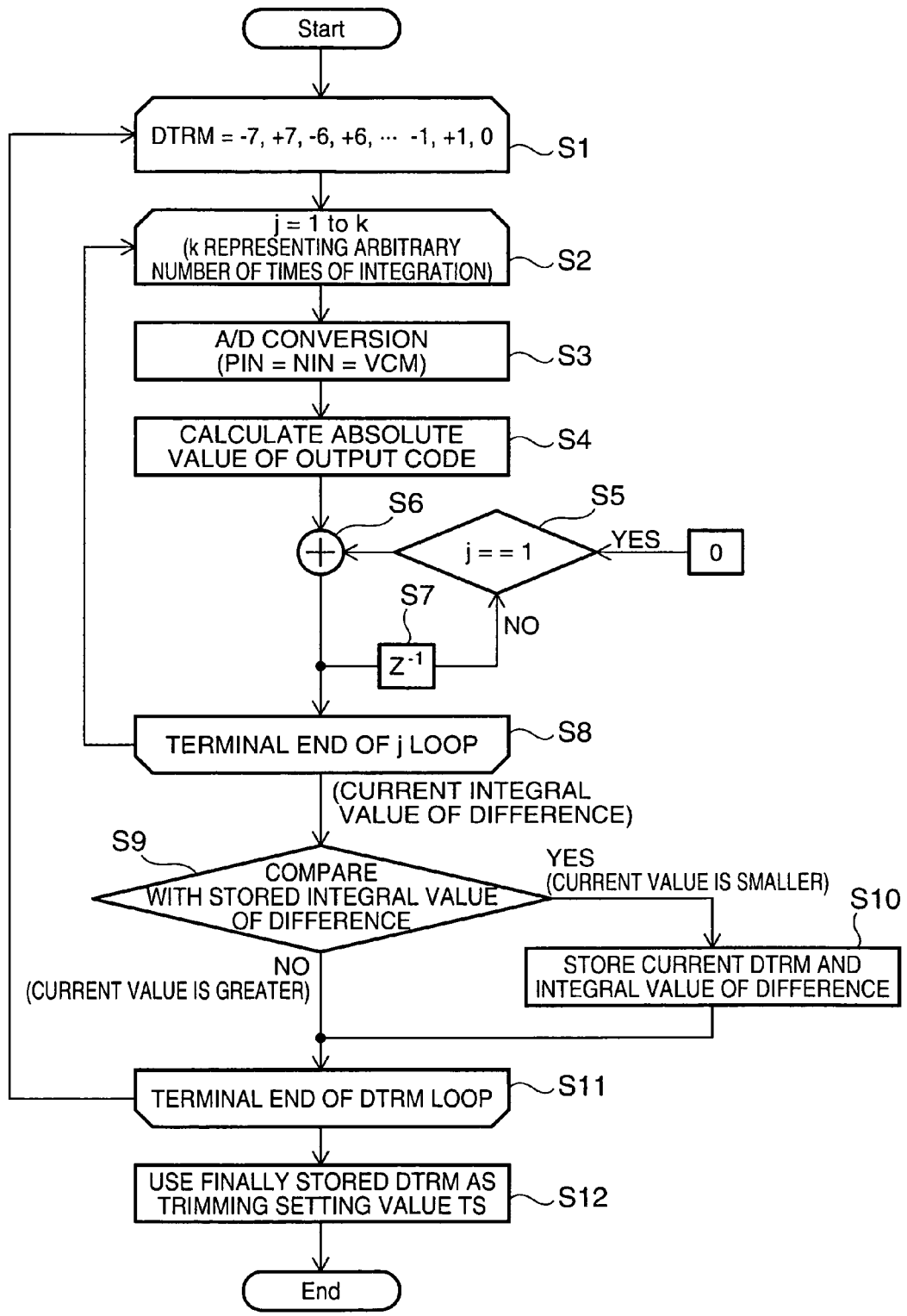
FIG. 14 It is a flowchart of processing to set a trimming setting value.

Next, an operation flow of the full-differential type A/D conversion circuit will be described. FIG. 14 shows a flowchart of processing to set the trimming setting value TS.

As shown in FIG. 14, as the processing is started, DTRMs are sequentially outputted (S1). DTRMs are outputted one by one in order of −7, +7, −6, +6, . . . , −1, +1, 0. Next, a loop for performing integration an arbitrary number of times k is started (S2). First, j=1 is set. Next, PIN=NIN=VCM is set and A/D conversion is performed (S3).

Next, an absolute value of an output code (output data) of A/D conversion is calculated (S4). Next, if j=(S5, YES), "0" is added to the absolute value of the output code (S6) and the addition value is stored (S7). Next, in the case of j<k, the j loop continues (S8) and j is incremented (j=j+1) (S2).

If j is incremented, for example, code data of code shift, described below, is changed and A/D conversion is performed (S3). In the case of j>1 (S5, NO), the stored addition value and the output code are added up (S6) and this addition value is stored (S7). If j=k results, the j loop ends (S8). The addition value stored at this point is the integral value of difference corresponding to the current trimming value.

Next, an integral value of difference corresponding to DTRM that is immediately before and the integral value of difference corresponding to the current DTRM are compared with each other (S9). If the integral value of difference corresponding to the current DTRM is smaller (S9, YES), the current DTRM and the integral value of difference thereof are stored (S10). Meanwhile, as for the first DTRM, this DTRM and the integral value of difference thereof are stored (S10). If the integral value of difference corresponding to the current DTRM is greater (S9, NO), DTRM and the integral value of difference are not updated.

Next, if it is not the final DTRM, the DTRM loop continues (S11). DTRM is changed to the next value (S1) and the processing of step S2 and the subsequent steps are repeated. In the case of the final DTRM, the DTRM loop ends (S11) and the last trimming value DTRM that is stored is set as the trimming setting value TS (S12). The processing then ends.

Although PIN=NIN=VCM is set in the above step S4, according to this embodiment, PIN and NIN may be set to other voltages. Also, PIN and NIN may be set to plural voltages and the above steps S1 to S12 may be carried out with each voltage. In this case, a final trimming setting value (for example, an average value) is set based on a trimming setting value found with each voltage.

FIG. 15 shows an example of successive approximation processing carried out after the trimming setting value TS is decided. This example is an example of processing where the trimming setting value is set to TS=+4 (X=0.5).

As shown in FIG. 15, comparison of bits D7 to D0 (D[7:0]) of the successive approximation is carried out in sequences 1 to 8 (steps S21 to S28), respectively. For example, in sequence 2, D6=1 is set and the output signal of the D/A conversion circuit and the input signal VIN are compared with each other. As shown in sequence 3, if the input signal VIN is smaller than the output signal of the D/A conversion circuit, the result of successive approximation D6=0 is stored.

The correction data S3 to S0 (S[3:0]) are S3 to S0 obtained in the case where DTRM=TS=+4 is given in the formula (10). Specifically, in sequences 1 to 4, where D[3:1]=000, the correction data S[3:0]=0000 is provided. Then, as D3=1 is set in sequence 5, the correction data S[3:0]=0100 corresponding to the trimming setting value TS is outputted. Also in the subsequent sequences 6 to 8, the correction data S3 to S0 change according to D3 to D1.

6. Code Shift

Figure 16:
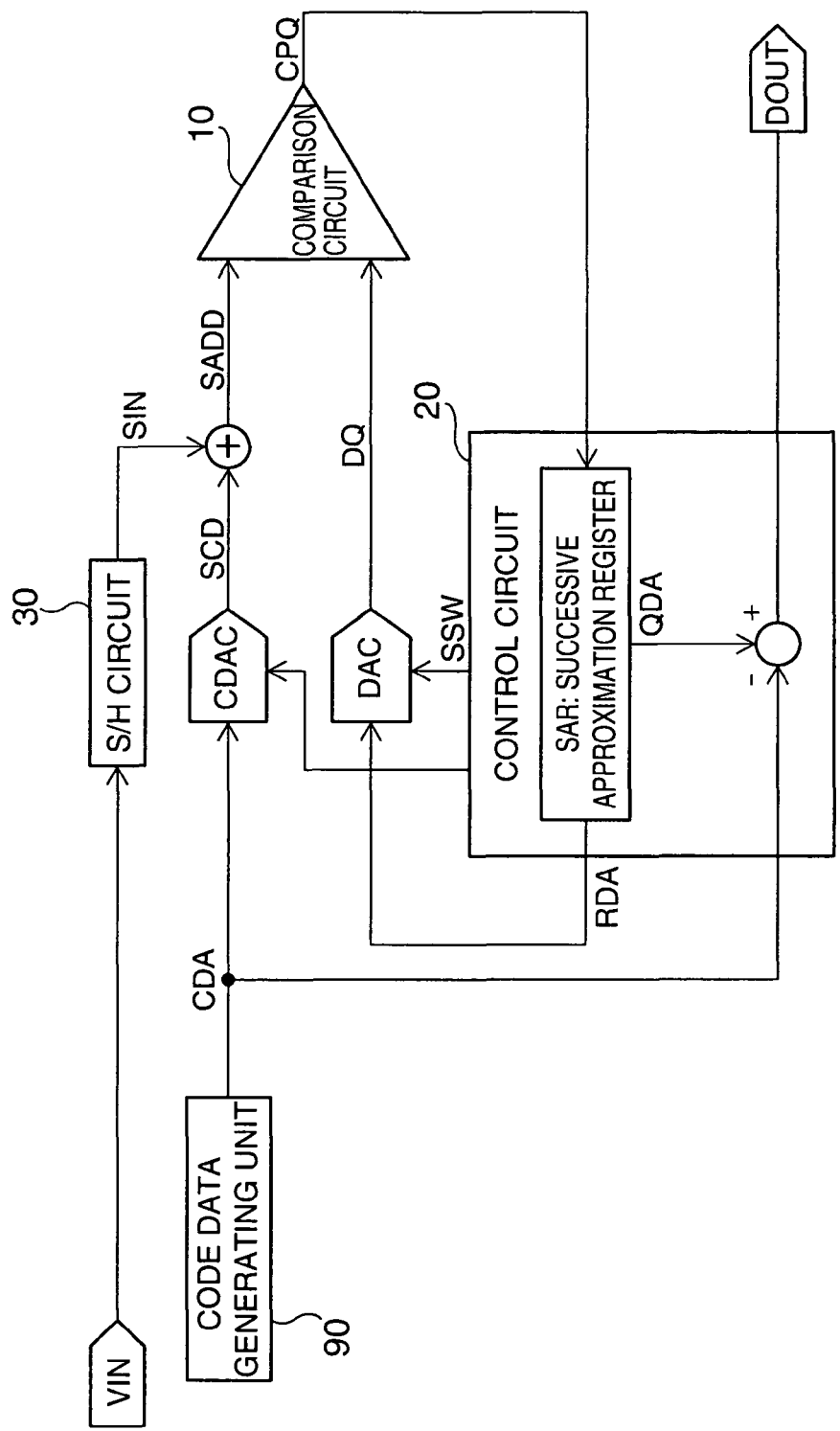
FIG. 16 It shows a second example of the configuration of A/D conversion circuit according to this embodiment.

FIG. 16 shows an example of the configuration of an A/D conversion circuit where code shift is performed. This A/D conversion circuit includes a comparison circuit 10, a control circuit 20, a D/A conversion circuit DAC, and a code shift D/A conversion circuit CDAC. In addition, the A/D conversion circuit can include an S/H circuit 30 and a code data generating unit 90. Also, the same components as the components described with reference to FIG. 1 or the like are denoted by the same reference numerals and the description thereof is omitted where appropriate.

Here, the A/D conversion circuit of this embodiment is not limited to the configuration of FIG. 16 and various modified embodiments are possible such as omitting part of the components or adding other components. For example, components of the code data generating unit 90 may be omitted and code data CDA may be directly inputted from outside.

The D/A conversion circuit CDAC performs D/A conversion of the code data CDA. Then, a code signal SCD corresponding to the code data CDA (a signal formed by D/A-converting CDA) is outputted. Here, the code data CDA is temporally changing data (digital data that changes every predetermined timing). Specifically, CDA is data having a different value every timing of A/D conversion that is carried out once or plural times, within a predetermined data range.

The data range in this case is a range defined by first digital data as an upper limit value and second digital data as a lower limit value. The timing of A/D conversion is, for example, the timing corresponding to each A/D conversion period when digital data is converted to an analog signal.

The code data generating unit 90 generates the code data CDA and outputs the code data to the D/A conversion circuit CDAC. For example, the code data generating unit outputs the code data CDA having a different value every timing of A/D conversion that is performed once or plural times, within a predetermined data range. Specifically, the code data generating unit 90 outputs the code data CDA having a different value every timing of A/D conversion that is performed once or plural times, within a data range of low-order bit data of the successive approximation data RDA.

Then, the comparison circuit 10 performs processing to compare an addition signal SAD of a sampled signal SIN and a code signal SCD with a D/A output signal DQ. Specifically, the comparison circuit 10 compares a signal SADD inputted to a first input terminal with the signal DQ inputted to a second input terminal. Meanwhile, in the case of a charge redistribution type or the like, the comparison circuit 10 performs processing to compare the signal SIN (sampled voltage) with an addition signal (addition voltage) of the signals DQ and SCD.

Then, the control circuit 20 outputs output data DOUT found on the basis of successive approximation result data QDA (final data) from the successive approximation register SAR and the code data CDA, as A/D conversion data of the input signal VIN. For example, if comparison between the addition signal SADD of the signals SIN and SCD and the signal DQ is performed as shown in FIG. 16, the control circuit 20 performs processing to subtract the code data CDA from the successive approximation result data QDA. Meanwhile, if comparison between the signal SIN and the addition signal of the signals DQ and SCD is performed as in the charge redistribution type, which will be described later, processing to add the code data CDA to the successive approximation result data QDA is performed.

In this embodiment, successive approximation is carried out so that the voltage of the input signal VIN and the voltage of the D/A output signal DQ become equal to each other, and thus the final successive approximation result data QDA is acquired. Then, the data obtained by subtracting the code data CDA from the acquired successive approximation result data QDA is outputted as data DOUT resulting from A/D conversion of the input signal VIN.

According to the above embodiment, since the code data CDA is updated every timing of one or plural A/D conversions, the successive approximation data has a different value even when the same input signal VIN is inputted. As shown in FIG. 3, as the successive approximation data D[7:0] changes, the non-linearity error (gap) included in the D/A output voltage VDAC changes according to the timing of A/D conversion. By thus using the code shift technique, the non-linearity error can be evaluated based on the above integral value of difference.

Figures 17A, 17B, 17C:
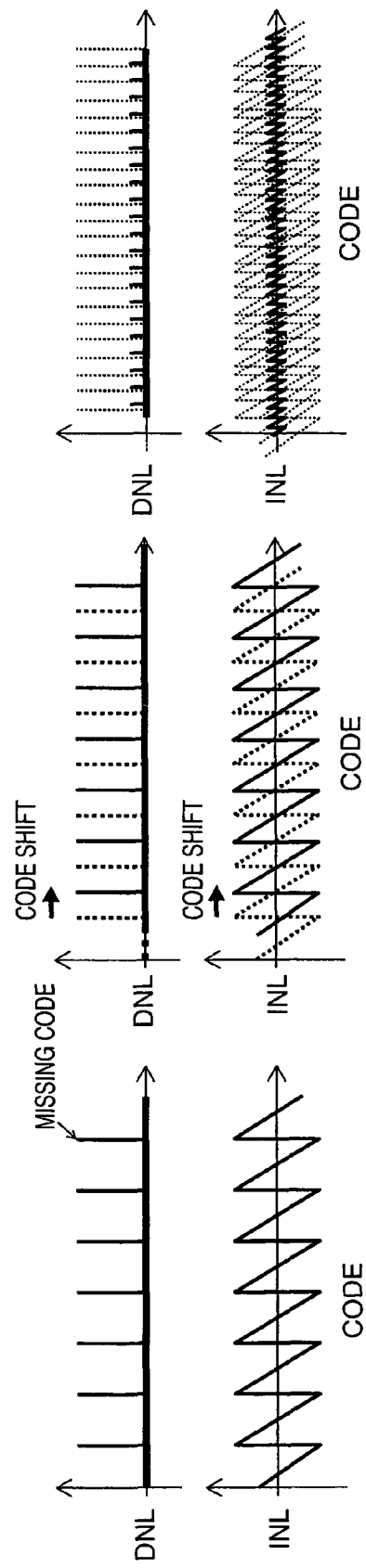
FIG. 17(A) to FIG. 17(C) are explanatory views about a code shift method.

Moreover, according to this embodiment, A/D conversion characteristics can be improved. This point will be described using a second comparative example of the A/D conversion circuit. In the second comparative example, the code data generating unit 90 and the code shift D/A conversion circuit CDAC are not provided. Also, in this second comparative example, as shown in FIG. 17(A), a missing code occurs at a specific code, for example, because of a DNL error or the like. For example, as DNL exceeds 1 LSB, a missing code phenomenon occurs such that a code is generated for which no output code exists.

In this respect, according to this embodiment, code shift as shown in FIG. 17(B) is performed by adding the signal SCD of the temporally changing code data CDA to the sampled signal SIN. Meanwhile, the solid line in FIG. 17(B) indicates the characteristic after code shift, and the broken line indicates the characteristic before code shift. That is, as viewed over a long time range, DNL and INL are improved as shown in FIG. 17(C) and good characteristics without any missing code phenomenon can be provided. That is, improvement of characteristics is achieved by dispersing the degradation of DNL characteristics (missing code) generated at a specific code to the surrounding codes using the temporally changing code data CDA.

For example, a case of A/D-converting a voltage corresponding to a code where a missing code is generated is now considered. If code shift is not carried out, non-linear conversion is carried out in a periphery of this input voltage. On the other hand, if code shift with a certain value is carried out, conversion with good linearity is carried out in the periphery of the input voltage. That is, as code shift is performed with various values, conversion that is non-linear at a certain code shift value but is linear at most code shift values is carried out.

Ultimately, as code shift is performed, relatively linear conversion is carried out with an input voltage where a missing code is generated inherently.

As described above, according to this embodiment, by simple processing of generating and adding the code data CDA, occurrence of a missing code is prevented and DNL and INL characteristics of the A/D conversion circuit are successfully improved.

Figure 18:
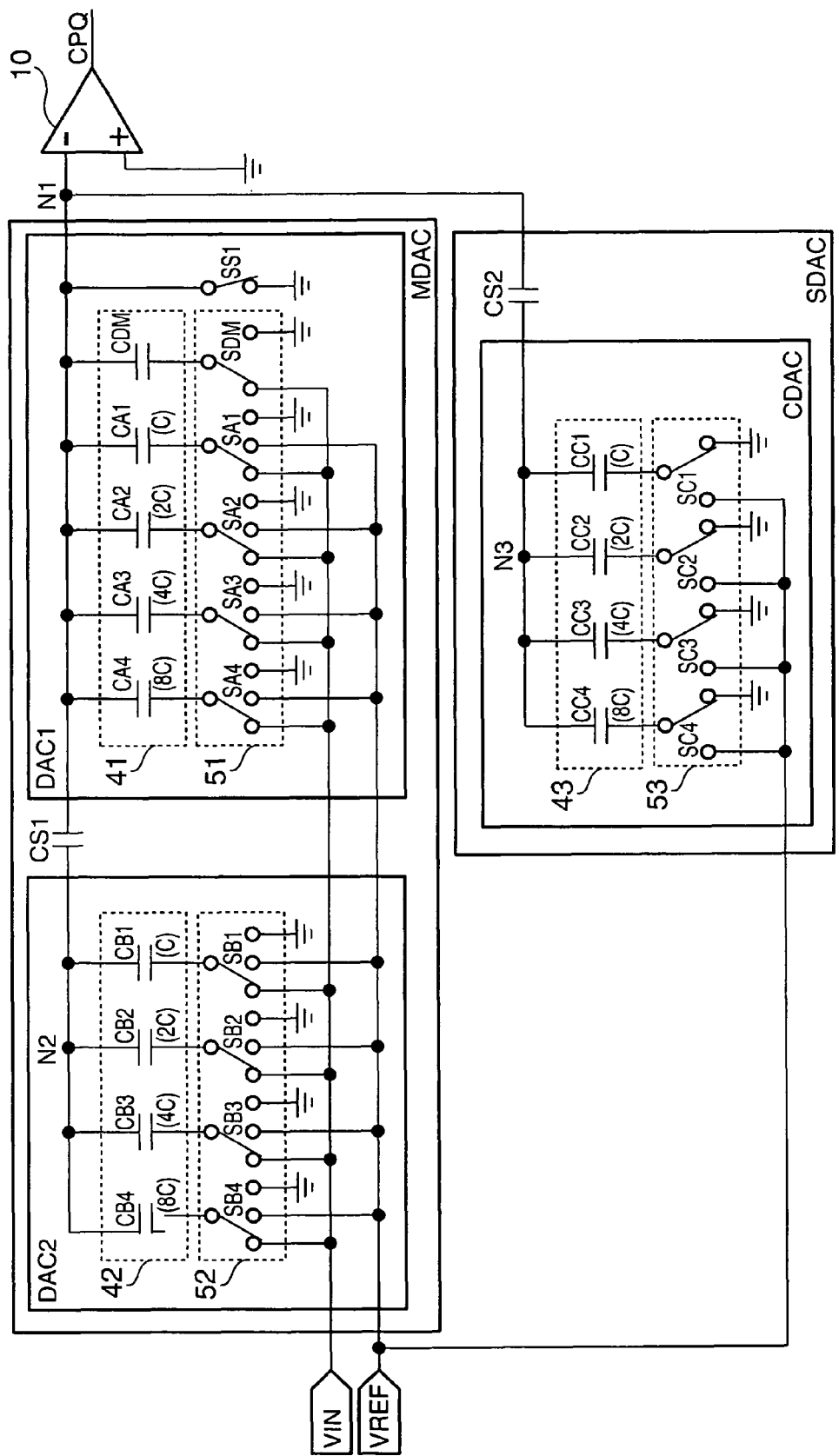
FIG. 18 It shows a fourth detailed example of the configuration of the A/D conversion circuit according to this embodiment.

FIG. 18 shows a fourth detailed example of the configuration of the A/D conversion circuit according to this embodiment. This example of the configuration includes a main D/A conversion circuit MDAC, a sub D/A conversion circuit SDAC, and a comparison circuit 10. These MDAC, SDAC and comparison circuit 10 represent the detailed example of the configuration of DAC, CDAC and the comparison circuit 10 of FIG. 17. MDAC and SDAC are formed by charge redistribution-type D/A conversion circuits. Meanwhile, the same components as the components described above with reference to FIG. 1 or the like are denoted by the same reference numerals and the description thereof is omitted where appropriate.

Here, if the code shift technique is applied to the embodiment described above with reference to FIG. 1 or the like, a code shift D/A conversion circuit CDAC is connected to the node N3 of the sub D/A conversion circuit SDAC shown in FIG. 1. Meanwhile, if the example of the configuration of FIG. 18 is applied to the A/D conversion circuit of FIG. 16, the code signal SCD of CDAC shown in FIG. 16 is equivalent to the output signal of SDAC shown in FIG. 18.

The sub D/A conversion circuit SDAC includes a second serial capacitor CS2 provided between a first node N1 (comparison node) and a third node N3. SDAC also includes a code shift D/A conversion circuit CDAC connected to the node N3. The code shift D/A conversion circuit CDAC includes a fourth capacitor array section 43 and a fourth switch array section 53.

The fourth capacitor array section 43 of CDAC includes plural capacitors CC1 to CC4. These capacitors CC1 to CC4 have one ends thereof connected to the third node N3. The capacitors CC1 to CC4 are weighted in a binary manner. For example, the capacitance values of CC1, CC2, CC3 and CC4 are C, 2C, 4C and 8C in the case of 4 bits.

The fourth switch array section 53 of CDAC includes plural switch elements SC1 to SC4. These switch elements SC1 to SC4 are connected to the other ends of the capacitors CC1 to CC4 of the fourth capacitor array section 43. Then, the switch elements SC1 to SC4 are switch-controlled based on code data CDA.

Specifically, in the case of 8-bit A/D conversion, the code data CDA is changed within a data range of four low-order bits of successive approximation data RDA. In this case, the switch elements SB1 to SB4 of the switch array section 52 of MDAC, too, are switch-controlled based on the four low-order bits of the successive approximation data RDA. By thus setting the range within which the code data CDA is changed to the data range of the successive approximation data RDA for switch-controlling the switch elements SB1 to SB4 of MDAC, occurrence of a missing code can be prevented effectively.

It is now assumed that the minimum resolution (voltage corresponding to LSB, quantized voltage) of the D/A conversion circuit MDAC is RS1 and that the minimum resolution of the D/A conversion circuit SDAC is RS2. In this case, RS2=RS1 holds in FIG. 18. Specifically, for example, the capacitance values of the serial capacitors CS1 and CS2 are the same (substantially the same) and the capacitance value of the capacitor CB1 corresponding to LSB of MDAC and the capacitance value of the capacitor CC1 corresponding to LSB of SDAC are the same (substantially the same) as well. That is, SDAC outputs a greater code voltage than a noise voltage, instead of a noise voltage below the minimum resolution RS1 (LSB) of MDAC. By doing so, code shift as shown in FIG. 17(B) can be realized. Moreover, RS2 RS1 may be employed, instead being limited to RS2=RS1.

Next, operations in this embodiment will be described in detail. During a sampling period of the input signal VIN, the other ends of the capacitors CC1 to CC4 are set to GND via the switch elements SC1 to SC4.

Next, as a successive approximation period of A/D conversion starts, the switch elements SC1 to SC4 of CDAC are switch-controlled based on each bit of the code data CDA, and the other ends of the capacitors CC1 to CC4 are set to VREF or GND.

For example, if the code data is CDA=1000, the other end of the capacitor CC4 is set to VREF and the other ends of the other capacitors CC3 to CC1 are set to GND. Meanwhile, if the code data is CDA=1100, the other ends of the capacitors CC4 and CC3 are set to VREF and the other ends of the other capacitors CC2 and CC1 are set to GND.

7. Electronic Apparatus

Figure 19:
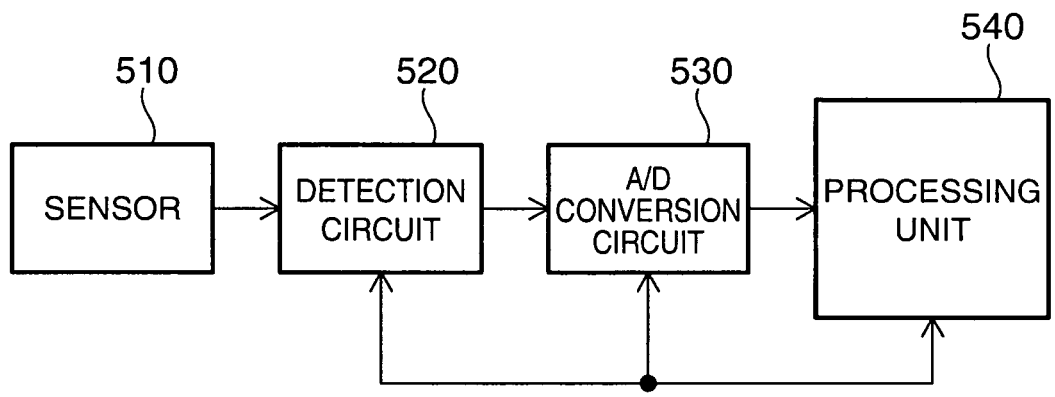
FIG. 19 It shows an example of the configuration of an electronic apparatus according to this embodiment.

FIG. 19 shows an example of the configuration of an electronic apparatus including the A/D conversion circuit of this embodiment. This electronic apparatus includes a sensor 510, a detection circuit 520, an A/D conversion circuit 530 and a processing unit 540. Also, various embodiments are possible such as omitting part of these components or adding other components. For example, the detection circuit 520, the A/D conversion circuit 530 and the processing unit 540 can be realized by an integrated circuit device.

As the electronic apparatus of FIG. 19, various kinds of apparatus can be considered, for example, physiological measuring equipment (pulsimeter, pedometer or the like), personal digital assistant, video equipment (digital camera, video camera), and timepiece.

The sensor 510 is a gyro sensor, acceleration sensor, photosensor, pressure sensor or the like. Various sensors are used according to the application of the electronic apparatus. The detection circuit 520 amplifies a sensor signal outputted from the sensor 510 and extracts a desired signal. Moreover, the A/D conversion circuit 530 converts the detection signal (desired signal) from the detection circuit 520 to digital data and outputs the digital data to the processing unit 540.

The processing unit 540 executes necessary digital signal processing to the digital data from the A/D conversion circuit 530. Also, the processing unit 540 may perform gain control or the like of the detection circuit 520. Here, as the digital signal processing carried out by the processing unit 540, various kinds of processing such as fast Fourier transform to extract an appropriate desired signal from the sensor signal can be considered.

Now, the embodiment is described above in detail, but those skilled in the art will easily be able to understand that many modifications are possible without substantially departing from the provision of new matter and effects of the invention. Therefore, such modified examples are considered as included in the scope of the invention. For example, a term that is described at least once together with a different term of a broader meaning or the same meaning in the specification or drawings can be replaced by that different term at any part of the specification or drawings. Also, the configurations and operations of the D/A conversion circuit, comparison circuit, control circuit, electronic apparatus and the like are not limited to the description of the embodiment and various modified embodiments are possible.

DESCRIPTION OF REFERENCE NUMERALS AND SIGNS 10 comparison circuit, 20 control circuit, 21 correction data output unit, 22 setting circuit, 23 trimming value output unit, 24 storage unit, 25 subtracting unit, 26 absolute value calculating unit, 27 integrating unit, 28 determining unit, 30 S/H circuit, 41 first capacitor array section, 42 second capacitor array section, 43 fourth capacitor array section, 44 third capacitor array section, 50 comparison unit, 51 first switch array section, 52 second switch array section, 53 fourth switch array section, 54 third switch array section, 90 code data generating unit, 510 sensor, 520 detection circuit, 530 A/D conversion circuit, 540 processing unit, CA1-CA4 capacitor, CB1-CB4 capacitor, CC1-CC4 capacitor, CD1-CD4 capacitor, CDA code data, CDAC trimming D/A conversion circuit, CDM dummy capacitor, CPQ comparison result signal, CS1 first serial capacitor, CS2 second serial capacitor, Cp, Cpn, Cpp parasitic capacitance, D0-D7 successive approximation data, D0-D3 low-order bit, D4-D7 high-order bit, DAC D/A conversion circuit, DAC1 first D/A conversion circuit, DAC2 second D/A conversion circuit, DOUT output data, DQ D/A output signal, DTA correction data, DTRM trimming value, GND ground voltage, MDAC main D/A conversion circuit, MDQ main D/A output signal, N1 first node, N2 second node, N3 third node, QDA successive approximation result data, RDA successive approximation data, S0-S3 correction data, SA1-SA4 switch element, SADD addition signal, SAR successive approximation register, SB1-SB4 switch element, SC1-SC4 switch element, SCD code signal, SD1-SD4 switch element, SDAC sub D/A conversion circuit, SDM switch element, SDQ correction signal, SIN sampled signal, SS1 switch element, TDAC trimming D/A conversion circuit, TS trimming setting value, TSR trimming setting value register, VCM common voltage, VDAC output voltage, VIN input signal, VREF power-supply voltage, X multiplier The entire content of Japanese Patent Application No. 2011-007104 (date of filing: Jan. 17, 2011) is incorporated in this specification by reference.

The invention claimed is:

1. An A/D conversion circuit comprising:
a comparison unit which performs a comparison operation in successive approximation; and
a control circuit which has a successive approximation register storing successive approximation data updated by the successive approximation,
wherein the control circuit outputs correction data for correcting non-linearity between an input signal and output data of the A/D conversion circuit to the comparison unit, based on one or plural bits of the successive approximation data, and
the comparison unit corrects the non-linearity based on the correction data, and wherein
the comparison unit includes:
a main D/A conversion circuit which performs D/A conversion of the successive approximation data and outputs a main D/A output signal corresponding to the successive approximation data, and
a sub D/A conversion circuit which corrects non-linearity between the successive approximation data and the main D/A output signal, based on the correction data from the control circuit,
a comparison circuit with an input terminal thereof connected to a first node,
the main D/A conversion circuit includes:
a first capacitor provided between the first node and a second node,
a first D/A conversion circuit which is connected to the first node and performs D/A conversion based on high-order bits of the successive approximation data, and
a second D/A conversion circuit which is connected to the second node and performs D/A conversion based on low-order bits of the successive approximation data, and
the sub D/A conversion circuit includes:
a second capacitor provided between the first node and a third node, and
a trimming D/A conversion circuit which is connected to the third node and performs D/A conversion of the correction data based on one or plural bits of the low-order bits.

2. The A/D conversion circuit according to claim 1, wherein
the sub D/A conversion circuit includes:
a code shift D/A conversion circuit connected to the third node,
the code shift D/A conversion circuit performs D/A conversion of temporally changing code data and outputs a code signal corresponding to the code data,
the comparison circuit performs processing to compare an addition signal of the main D/A output signal, the correction signal and the code signal, with a sampled signal of the input signal, and
the control circuit outputs data found based on successive approximation result data and the code data, as output data.

3. An A/D conversion circuit comprising:
a comparison unit which performs a comparison operation in successive approximation; and
a control circuit which has a successive approximation register storing successive approximation data updated by the successive approximation,
wherein the control circuit outputs correction data for correcting non-linearity between an input signal and output data of the A/D conversion circuit to the comparison unit, based on one or plural bits of the successive approximation data, and
the comparison unit corrects the non-linearity based on the correction data, and
wherein the control circuit outputs the correction data based on a multiplication value of the trimming setting value by one or plural bits of the successive approximation data.

4. The A/D conversion circuit according to claim 3, wherein the control circuit includes a trimming setting value register which stores a trimming value that minimizes the non-linearity, as the trimming setting value, and outputs the correction data based on the stored trimming setting value.

5. The A/D conversion circuit according to claim 3, further comprising a setting circuit which sets the trimming setting value based on the output data,
wherein the control circuit sequentially outputs first to n-th correction data based on first to n-th trimming values which are different values (n being a natural number), to the comparison unit, and
the setting circuit sets a trimming value that minimizes the non-linearity, from among the first to n-th trimming values, as the trimming setting value.

6. The A/D conversion circuit according to claim 5, wherein the setting circuit
multiplies, plural times, an absolute value of the output data corresponding to an i-th trimming value (i being a natural number equal to or smaller than n) from among the first to n-th trimming values and thus finds an i-th integrated value, and sets a trimming value corresponding to a minimum integrated value from among first to n-th integrated values, as the trimming setting value.

7. The A/D conversion circuit according to claim 5, wherein the setting circuit finds a difference value between (j+1)th output data corresponding to the i-th trimming value from among the first to n-th trimming values and j-th output data, as a j-th difference value, then integrates absolute values of first to k-th difference values (k being a natural number; j being a natural number equal to or smaller than k) to find an i-th integrated value, and sets a trimming value corresponding to a minimum integrated value from among the first to n-th integrated values, as the trimming setting value.

8. An integrated circuit device comprising an A/D conversion circuit, the A/D conversion circuit including:
a comparison unit which performs a comparison operation in successive approximation; and
a control circuit which has a successive approximation register storing successive approximation data updated by the successive approximation,
wherein the control circuit outputs correction data for correcting non-linearity between an input signal and output data of the A/D conversion circuit to the comparison unit, based on one or plural bits of the successive approximation data, and
the comparison unit corrects the non-linearity based on the correction data, and wherein
the comparison unit includes:
a main D/A conversion circuit which performs D/A conversion of the successive approximation data and outputs a main D/A output signal corresponding to the successive approximation data, and
a sub D/A conversion circuit which corrects non-linearity between the successive approximation data and the main D/A output signal, based on the correction data from the control circuit,
a comparison circuit with an input terminal thereof connected to a first node,
the main D/A conversion circuit includes:
a first capacitor provided between the first node and a second node,
a first D/A conversion circuit which is connected to the first node and performs D/A conversion based on high-order bits of the successive approximation data, and
a second D/A conversion circuit which is connected to the second node and performs D/A conversion based on low-order bits of the successive approximation data, and
the sub D/A conversion circuit includes:
a second capacitor provided between the first node and a third node, and
a trimming D/A conversion circuit which is connected to the third node and performs D/A conversion of the correction data based on one or plural bits of the low-order bits.

9. An integrated circuit device comprising an A/D conversion circuit, the A/D conversion circuit including:
a comparison unit which performs a comparison operation in successive approximation; and
a control circuit which has a successive approximation register storing successive approximation data updated by the successive approximation,
wherein the control circuit outputs correction data for correcting non-linearity between an input signal and output data of the A/D conversion circuit to the comparison unit, based on one or plural bits of the successive approximation data, and
the comparison unit corrects the non-linearity based on the correction data, and
wherein the control circuit outputs the correction data based on a multiplication value of the trimming setting value by one or plural bits of the successive approximation data.

10. An electronic apparatus comprising an A/D conversion circuit, the A/D conversion circuit including:
a comparison unit which performs a comparison operation in successive approximation; and
a control circuit which has a successive approximation register storing successive approximation data updated by the successive approximation,
wherein the control circuit outputs correction data for correcting non-linearity between an input signal and output data of the A/D conversion circuit to the comparison unit, based on one or plural bits of the successive approximation data, and
the comparison unit corrects the non-linearity based on the correction data, and wherein
the comparison unit includes:
a main D/A conversion circuit which performs D/A conversion of the successive approximation data and outputs a main D/A output signal corresponding to the successive approximation data, and
a sub D/A conversion circuit which corrects non-linearity between the successive approximation data and the main D/A output signal, based on the correction data from the control circuit,
a comparison circuit with an input terminal thereof connected to a first node,
the main D/A conversion circuit includes:
a first capacitor provided between the first node and a second node,
a first D/A conversion circuit which is connected to the first node and performs D/A conversion based on high-order bits of the successive approximation data, and
a second D/A conversion circuit which is connected to the second node and performs D/A conversion based on low-order bits of the successive approximation data, and
the sub D/A conversion circuit includes:
a second capacitor provided between the first node and a third node, and
a trimming D/A conversion circuit which is connected to the third node and performs D/A conversion of the correction data based on one or plural bits of the low-order bits.

11. An electronic apparatus comprising an A/D conversion circuit, the A/D conversion circuit including:
a comparison unit which performs a comparison operation in successive approximation; and
a control circuit which has a successive approximation register storing successive approximation data updated by the successive approximation, wherein the control circuit outputs correction data for correcting non-linearity between an input signal and output data of the A/D conversion circuit to the comparison unit, based on one or plural bits of the successive approximation data, and the comparison unit corrects the non-linearity based on the correction data, and wherein the control circuit outputs the correction data based on a multiplication value of the trimming setting value by one or plural bits of the successive approximation data.

* * * * *